(12) United States Patent
Cabahug et al.

(10) Patent No.: US 11,296,069 B2
(45) Date of Patent: Apr. 5, 2022

(54) SUBSTRATE INTERPOSER ON A LEADERFRAME

(71) Applicant: FAIRCHILD SEMICONDUCTOR CORPORATION, Phoenix, AZ (US)

(72) Inventors: Elsie Agdon Cabahug, Cebu (PH); Marie Clemens Ypil Quinones, Cebu (PH); Maria Cristina Estacio, Lapulapu (PH); Romel Nogas Manatad, Cebu (PH); Chung-Lin Wu, San Jose (CA); Jerome Teysseyre, Singapore (SG)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/737,628

(22) Filed: Jan. 8, 2020

(65) Prior Publication Data
US 2020/0219866 A1 Jul. 9, 2020

Related U.S. Application Data

(62) Division of application No. 15/079,603, filed on Mar. 24, 2016, now Pat. No. 10,546,847.

(60) Provisional application No. 62/139,378, filed on Mar. 27, 2015.

(51) Int. Cl.
| H01L 25/00 | (2006.01) |
| H01L 25/065 | (2006.01) |
| H01L 23/495 | (2006.01) |
| H01L 23/31 | (2006.01) |

(52) U.S. Cl.
CPC ........ *H01L 25/50* (2013.01); *H01L 23/49531* (2013.01); *H01L 23/49551* (2013.01); *H01L 23/49575* (2013.01); *H01L 25/0655* (2013.01); *H01L 23/3107* (2013.01); *H01L 2224/45144* (2013.01); *H01L 2224/48091* (2013.01); *H01L 2224/48247* (2013.01); *H01L 2224/48465* (2013.01); *H01L 2924/181* (2013.01)

(58) Field of Classification Search
None
See application file for complete search history.

(56) References Cited

U.S. PATENT DOCUMENTS

| 5,929,514 | A | * | 7/1999 | Yalamanchili | .......... | H01L 24/32 |
| | | | | | | 257/676 |
| 9,177,925 | B2 | | 11/2015 | Ashrafzadeh et al. | | |

(Continued)

FOREIGN PATENT DOCUMENTS

| JP | H07007033 A | 1/1995 |
| TW | 201034151 A1 | 9/2010 |
| TW | 201205743 A | 2/2012 |

*Primary Examiner* — Anthony Ho
*Assistant Examiner* — Kevin Quinto
(74) *Attorney, Agent, or Firm* — Brake Hughes Bellermann LLP

(57) ABSTRACT

In one general aspect, a device can include a leadframe including at least one of an external input terminal or an external output terminal, an interposer made of an insulating material, and a redistribution layer coupled to the interposer and made of a conductive material. The redistribution layer can include a plurality of traces. The device can also include a semiconductor die disposed between the redistribution layer and the leadframe.

16 Claims, 20 Drawing Sheets

(56) References Cited

U.S. PATENT DOCUMENTS

| | | | |
|---|---|---|---|
| 2004/0126977 A1* | 7/2004 | Bustos | H01L 21/28167 438/305 |
| 2006/0175696 A1* | 8/2006 | Kim | H01L 23/13 257/686 |
| 2007/0195563 A1 | 8/2007 | Shiraishi et al. | |
| 2010/0133675 A1* | 6/2010 | Yu | H01L 25/105 257/686 |
| 2012/0168917 A1 | 7/2012 | Yim et al. | |
| 2014/0312458 A1* | 10/2014 | Ashrafzadeh | H01L 25/0652 257/531 |
| 2015/0200162 A1 | 7/2015 | Constantino et al. | |

* cited by examiner

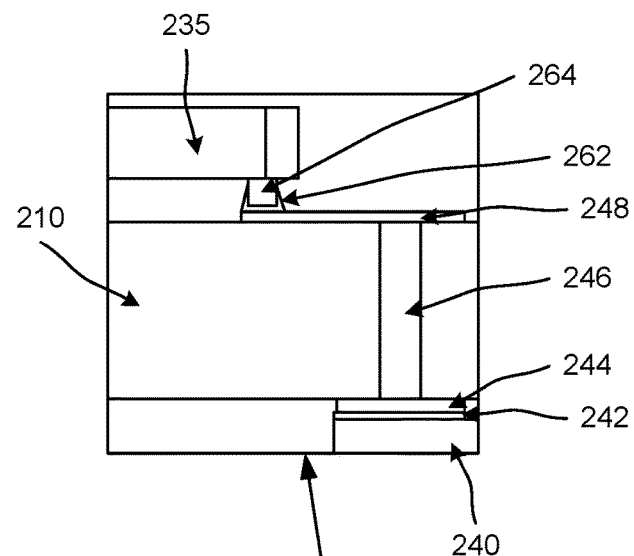
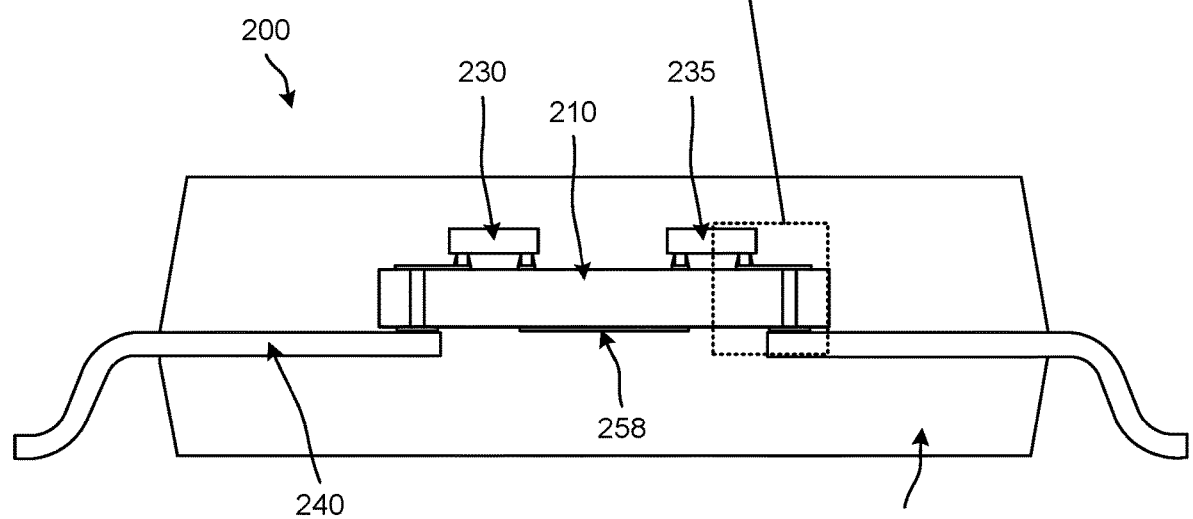

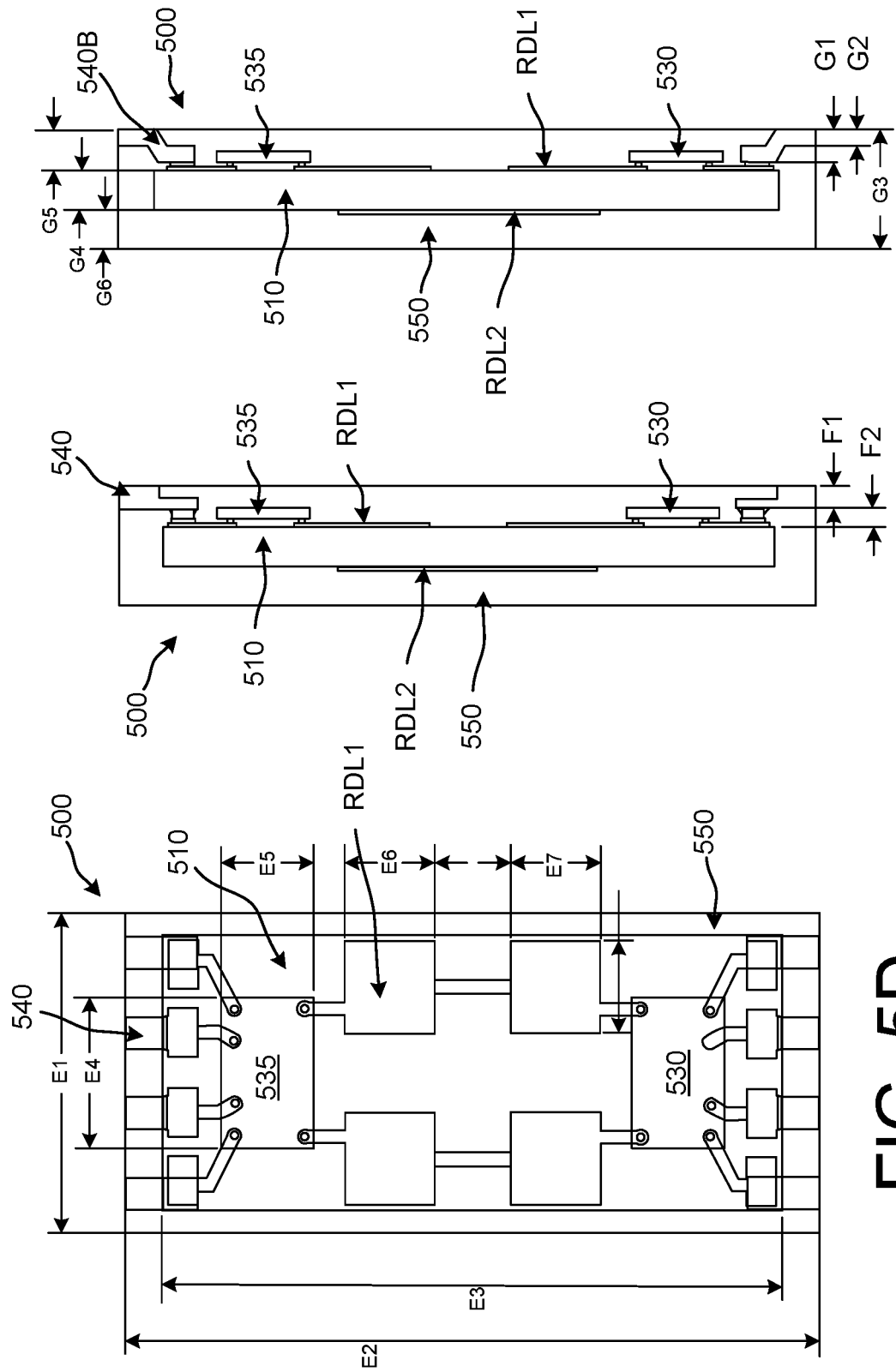

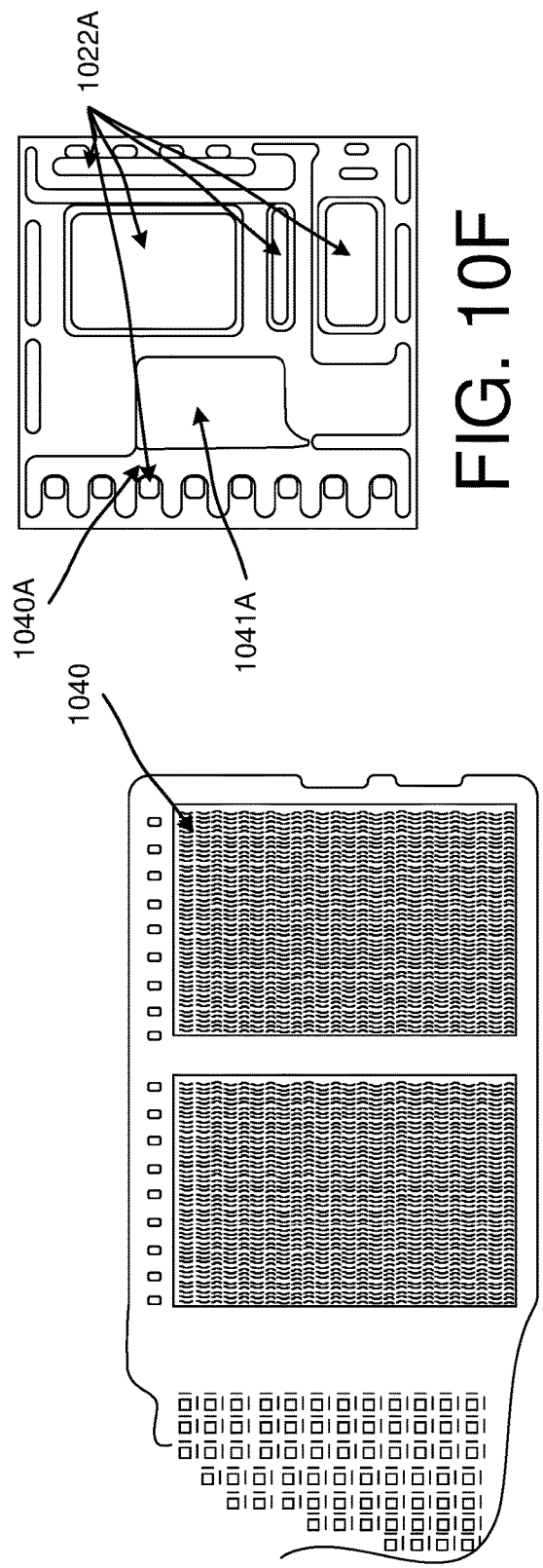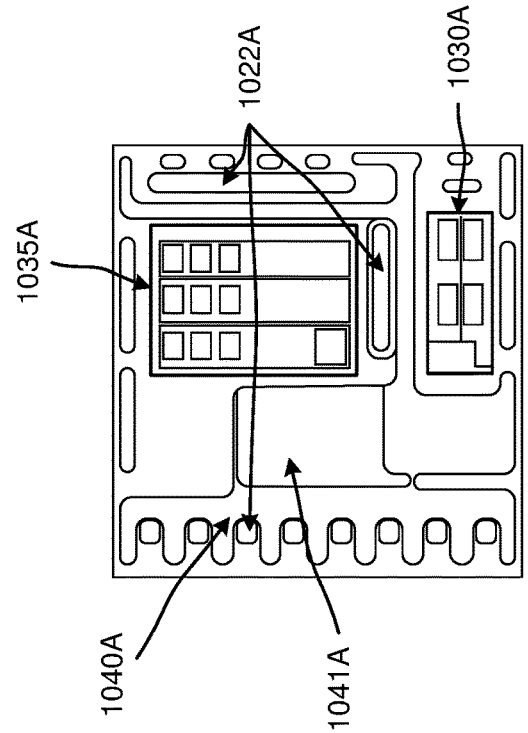
FIG. 10E
FIG. 10F
FIG. 10G

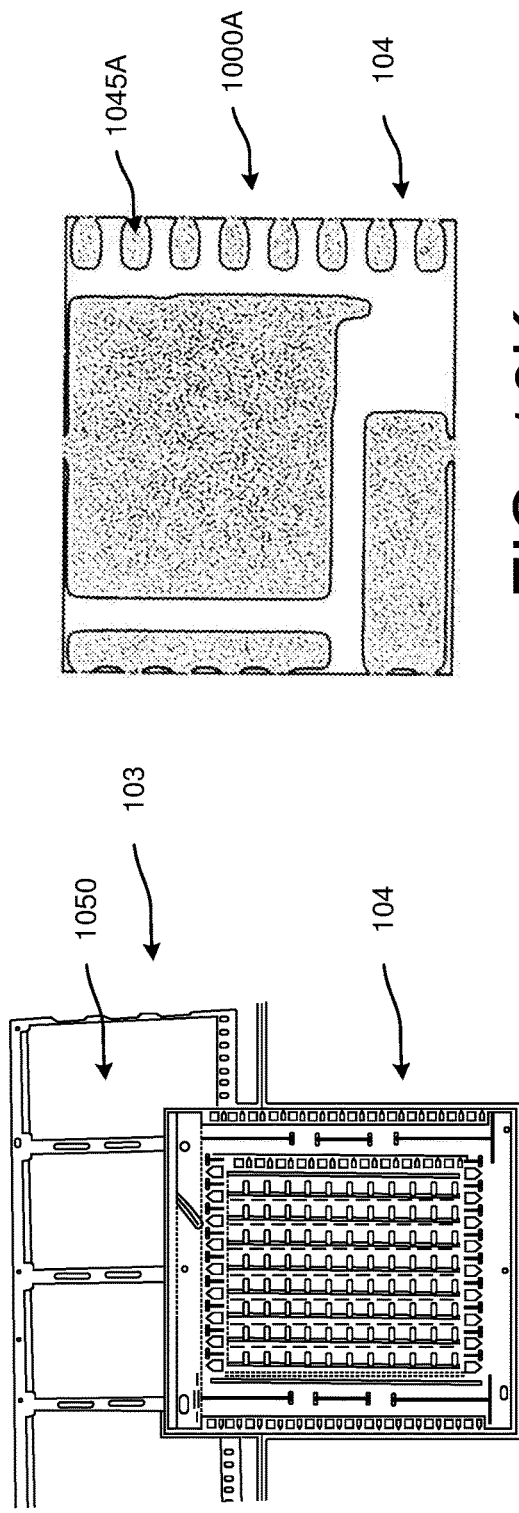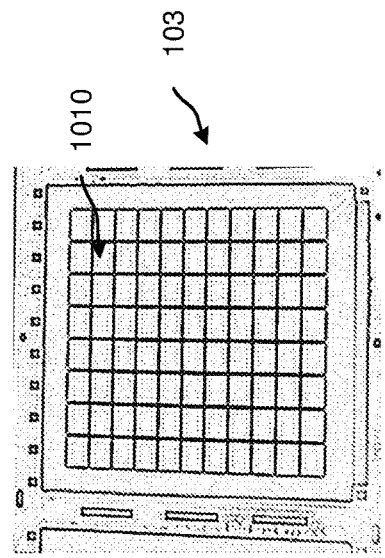
FIG. 10K
FIG. 10J
FIG. 10L

SUBSTRATE INTERPOSER ON A LEADERFRAME

RELATED APPLICATIONS

This application claims priority to and the benefit of U.S. Non-Provisional application Ser. No. 15/079,603, filed Mar. 24, 2016, and U.S. Provisional Application 62/139,378, filed Mar. 27, 2015, each of which is incorporated by reference herein in its entirety.

TECHNICAL FIELD

This description relates to substrate interposer on a leadframe.

BACKGROUND

As the world of electronics moves towards smaller sizes, higher efficiency, and lower cost, integration techniques are in great demand for making smaller, more intelligent and more efficient products, in a variety of spaces including the power management space. The highest performance devices, such as power devices, are often manufactured discretely as opposed to being integrated in an integrated circuit (IC) process. The cost of producing such discrete devices can be a fraction of those produced using such complex processes because the mask layers used in discrete devices are generally a fraction (e.g., one half, one third) of the number of those used in more complex IC processes. Many known approaches have used, for example, leadframe packages and copper clips to achieve integration, but the shortcomings of such packages have been higher cost, inferior thermal performance, higher inductance, larger size and generally a lower level of integration. Thus, a need exists for systems, methods, and apparatus to address the shortfalls of present technology and to provide other new and innovative features.

BRIEF DESCRIPTION OF THE DRAWINGS

FIGS. 2A and 2B are diagrams that illustrate a variation of the device shown in FIG. 1.

FIGS. 5A through 5F are diagrams illustrate a device that is yet another variation of the device shown in FIG. 1.

SUMMARY

In one general aspect, a device can include a leadframe including at least one of an external input terminal or an external output terminal, an interposer made of an insulating material, and a redistribution layer coupled to the interposer and made of a conductive material. The redistribution layer can include a plurality of traces. The device can also include a semiconductor die disposed between the redistribution layer and the leadframe.

DETAILED DESCRIPTION

Figure 1:
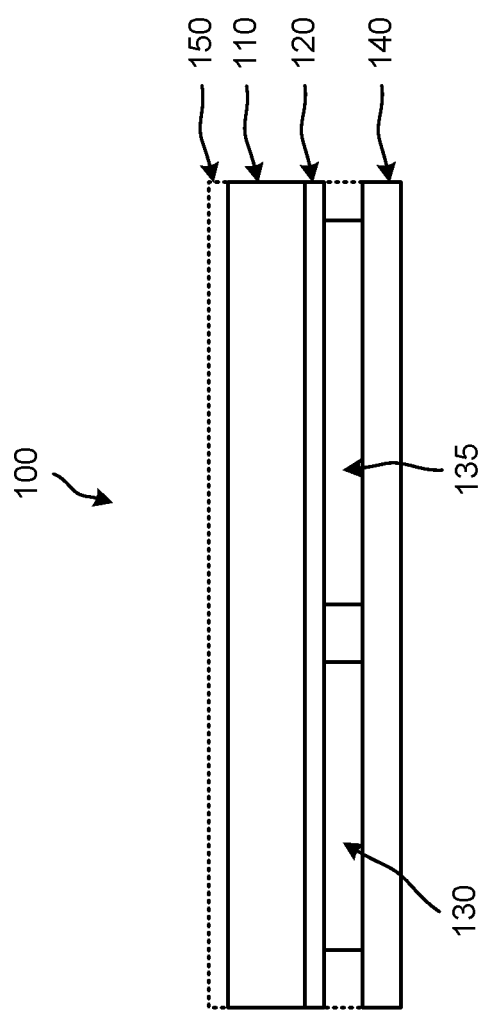
FIG. 1 is a diagram that illustrates an interposer included in a device.

FIG. 1 is a diagram that illustrates an interposer 110 included in a device 100. In some implementations, the device 100 can be referred to as a packaged device or as a package. As shown in FIG. 1, the device 100 includes a redistribution layer 120, semiconductor die 130, 135, and a leadframe 140. The redistribution layer 120 is disposed between the semiconductor die 130, 135 and the interposer 110. Specifically, the redistribution layer 120 can be electrically coupled to each of the semiconductor die 130, 135 and can be coupled to the interposer 110. In some implementations, electrical coupling can be achieved via one or more conductive materials or coupling mechanisms such as a solder, an electrical paste, and/or so forth. In some implementations, when one element is referred to as being in contact with (e.g., or electrically in contact with) another element, the two elements can be coupled via a conductive material such as a solder, an electrical paste, and/or so forth.

In the implementation shown in FIG. 1, the interposer 110 can serve as a platform through which connections for a variety of semiconductor devices (e.g., semiconductor die 130, 135, chips, passive devices, and/or so forth) can be made. Specifically, the electrical connections can be provided via the redistribution layer 120, which is coupled to the interposer 110. In some implementations, the interposer 110 (or conductive components coupled thereto (e.g., redistribution layer 120)) can be soldered onto the leadframe 140 to establish electrical connection of the active components (e.g., semiconductor die 130, 135) internal to the device 100. In some implementations, the redistribution layer can include one or more traces that can be several microns wide and/or thick (e.g., 10 microns, 30, microns, 40 microns) or wider and/or thicker (e.g., greater than 40 microns, 100 microns).

Although not shown in FIG. 1, one of more electrical connections can be disposed within or can be made through the interposer 110. In other words, electrical connection between an element a first side of the interposer 110 and a second side of the interposer 110 can be made using a via (e.g., an electrical via, a metal via). For example, an electrical connection between the redistribution layer 120 (which is disposed on a bottom side of the interposer 110 as shown in FIG. 1) and a semiconductor die (which can be disposed on a top side of the interposer 110 is shown in FIG. 1) can be made using a via disposed within the interposer 110.

A molding 150 (e.g., molding compound) (which is illustrated with a dashed line) can be included in the device 100. As shown in FIG. 1, the molding 150 can be coupled to (e.g., disposed on) the interposer 110. As shown in FIG. 1, one more of the semiconductor die 130, 135 can be disposed within at least a portion of the molding 150. Also shown in FIG. 1, at least a portion of the leadframe 140 is exposed through the molding 150. Accordingly, one or more exposed leads and/or pads for board mounted connections (e.g., external input terminal(s) and/or external output terminal(s)) can be through the leadframe 140, which is exposed through the molding 150. Accordingly, the molding 150 that may be used to, at least partially, encase (e.g., cover) (or can encapsulate in some implementations) the device 100. More details related to external input and/or external output terminals are described below.

In some implementations, one or more of the semiconductor die 130, 135 can be an upright configuration or in a flip chip configuration with one or more terminals or contacts facing upward (toward the interposer 110) or facing downward (toward the leadframe 140). In some implementations, one or more of the semiconductor die 130, 135 can be oriented so that a drain (or drain contact) of the one or more of the semiconductor die 130, 135 is coupled to (e.g., directly coupled to) the leadframe 140. In some implementations, the flip chip and/or non-flip chip configuration can be critical for operation in some applications. In some implementations, one or more of the semiconductor die 130, 135 can be oriented so that a source (or source contact) of the one or more of the semiconductor die 130, 135 is coupled to (e.g., directly coupled to) the leadframe 140. In some implementations, one or more of the semiconductor die 130, 135 can be oriented so that a gate (or gate contact) of the one or more of the semiconductor die 130, 135 is coupled to (e.g., directly coupled to) the leadframe 140.

In some implementations, the semiconductor die 130 and/or 135 can be coupled to the leadframe 140 and/or the redistribution layer 120 via a solder (not shown). Accordingly, as an example, a stack along the vertical direction can include the redistribution layer 120, a first solder, the semiconductor die 130, a second solder, and the leadframe 140. In some implementations, the leadframe 140 can be a preformed (e.g., predefined) conductive or electrical layer that can be stamped, cut from a conductor (e.g., metal), and/or so forth. This can be contrasted with a conductive layer that can be electroplated, grown, sputtered, and/or so forth (e.g., redistribution layer 120) on, for example, the interposer 110.

The interposer 110 can be made of a variety of materials including a ceramic, a silicon-based material, an organic substrate, a pre-molded substrate, and/or so forth. In some implementations, the thickness (e.g., vertical thickness) of the interposer 110 can be varied depending on the target package thickness of the final package as required for the application. In some implementations, the interposer 110 can be made of an insulating material. The redistribution layer 120 can be made of one or more conductive materials such as copper, aluminum, and/or so forth. Depending on the particular implementation, the leadframe 140 (or portions thereof) of the device 100 may be formed (e.g., using the approaches described herein) from copper, alloys of copper, or any number of other materials that are suitable for forming leadframes for packaged semiconductor devices. In some implementations, distances (e.g., thicknesses, directions) orthogonal to the plane of the interposer 110 can be referred to as vertical, and distance aligned along the plane of the interposer 110 can be referred to as horizontal.

In some implementations, an organic solderability preservative (OSP) treatment can be performed on the redistribution layer 120 so that desirable and repeatable solder wetting can be achieved on the redistribution layer 120.

The molding 150 may be a liquid molding compound that that is injected or flowed and then heat-cured to harden the molding 150. In other implementations, the molding 150 may be a thermoset plastic molding compound. In still other implementations, other molding 150 may be used. In some implementations, the molding 150 can include a variety of materials such as a plastic, a resin, an epoxy, a phenolic hardener, a silica material, and/or so forth.

Although not shown in FIG. 1, one or more electrical connections can be made between the redistribution layer 120 and the leadframe 140. In some implementations, an electrical connection can be defined between the redistribution layer 120 and the leadframe 140 using a pillar (e.g., a conductive pillar, a copper pillar). More details related to pillars are described below.

In some implementations, a planarization process (e.g., a buffing process) in the preparation of the pillars to define (e.g., control) pillar height (or thickness (e.g., vertical thickness)) variation at a minimum to achieve a planar/flat surface for desirable contact with, for example, a solder during assembly.

In some implementations, the leadframe 140 can include one or more external input terminals and/or one or more external output terminals. For example, the leadframe 140 can include an external input terminal electrically coupled to one or more of the semiconductor die 130, 135 so that one or more of the semiconductor die 130, 135 can receive an external input (e.g., an external input signal, external power) from another device (not shown) outside of the device 100. As another example, the leadframe 140 can include an external input terminal electrically coupled to one or more of the semiconductor die 130, 135 so that one or more of the semiconductor die 130, 135 can send an external output (e.g., an external output signal) to another device outside of the device 100. As noted above, one or more of the external input and/or external output terminals can be exposed leads and/or pads exposed through the molding 150.

In some implementations, the redistribution layer 120 may be used to electrically connect portions between one or more of the semiconductor die 130, 135. In some implementations, the redistribution layer 120 may be used to electrically connect portions between one or more of the semiconductor die 130, 135, and may or may not have an external output terminal out of the device 100 and/or an external input terminal into the device 100. If excluding external input and/or external output terminals, the redistribution layer 120 may be entirely disposed within the device 100 (e.g., within a molding 150 of the device).

In some implementations, the redistribution layer 120 may be used to electrically connect portions of one or more of the semiconductor die 130, 135 with one or more portions of the leadframe 140. In some implementations, the redistribution layer 120 may be used to electrically connect portions of one or more of the semiconductor die 130, 135 with one or more portions of the leadframe 140, and may or may not have an external output terminal out of the device 100 and/or an external input terminal into the device 100.

Although the various implementations described herein may be described in terms of a particular type of material, various materials can be used for each of the components.

One or more of the semiconductor die 130, 135 can be, or can include, a variety of devices such as a bipolar junction transistor (BJT), an insulated gate bipolar transistor (IGBT), a superjunction field effect transistor (FET), a metal oxide semiconductor field effect transistor (MOSFET) device, a silicon carbide (SiC) device (e.g., a SiC BJT), other transistor. In some implementations, one or more of the semiconductor die 130, 135 can be, or can include, a circuit such as a filter circuit, a controller circuit, a driver circuit, a communication circuit (e.g., a receiver and/or transmitter), and/or so forth. In some implementations, one or more of the semiconductor die 130, 135 can be, or can include special purpose logic circuitry, combinational logic, a field programmable gate array (FPGA), an application-specific integrated circuit (ASIC). In some implementations, the device 100 (and/or one or more of the semiconductor die 130, 135) can be used for many different types of systems such as power management systems, radio frequency (RF) systems, controller systems, computing systems, digital and/or analog systems, etc. One or more of the semiconductor die 130, 135 can include, for example, a high-voltage (HV) (or high side) or low-voltage (LV) (or low side) transistor implemented therein, such as a field-effect transistor (e.g., a vertical FET, a lateral FET). In some implementations, the device 100 can include more than two semiconductor die or less than two semiconductor die. In some implementations, the device 100 can define a DC to DC buck converter (e.g., a half bridge).

As a specific example, if one or more of the semiconductor die 130, 135 is (or includes) a MOSFET device, internal connections on the gate and source pads of the MOSFET device can be defined using one or more conductor lines (e.g., conductor lines defined within the redistribution layer 120) coupled to (e.g., integral to) the interposer 110. In some implementations, the one or more conductor lines can be made of copper (e.g., copper of 40 µm or thicker) and can be routed to accommodate the MOSFET device gate and source pad layout. The one or more conductor lines can be routed to allow electrical connection to the leadframe 140 by forming (e.g., growing) a pillar (e.g., plated copper pillar) (not shown in FIG. 1). In some implementations the connection to the leadframe 140 can correspond with the final exposed lead or pad. In some implementations, all exposed pads (e.g., input and/or output terminals) are defined on the leadframe 140 side while all conductor connections to semiconductor die (e.g., semiconductor die 130, 135) are done on the interposer 110 (e.g., a redistribution layer 120 coupled to the interposer 110).

In some implementations, the drain connection of the MOSFET device can be coupled to the leadframe 140 with a layout on the bottom side also functions as the final exposed pad of the package of the device 100. In some implantations, a pillar (e.g., copper pillar) (not shown in FIG. 1) on the interposer 110 can be coplanar to the MOSFET device (or die) back. In some implementations, a plating tolerance on the pillar and the semiconductor die (e.g., 130, 135) back side dictates the final stand-off of the interposer 110. In some implementations, this feature can be implemented for desirable soldering of the pillar to the leadframe 140 and MOSFET device (or die) back to the leadframe 140. In some implementations, given the potential plating tolerance on the pillar, the MOSFET device (or die) back side can dictate the final stand-off of the interposer 110. The pillar on the interposer 110 is coplanar to a die (e.g., MOSFET die) back. This can be desirable for soldering of the pillar to the leadframe 110 and die back to the leadframe 140.

In some implementations, all exposed pads are defined using the leadframe 140 while all conductor connections to the semiconductor die 130, 135 are defined using the redistribution layer 120 of the interposer 110. In some implementations, the drain connection of one or more of the semiconductor die 130, 135 (e.g., MOSFET) is on the leadframe 140 whose layout on the bottom side also serves as the final exposed pad of the package of the device 100.

In some implementations, the devices herein can have advantage over implementations that use liquid epoxy to encapsulate the package. Liquid epoxy can result in voids, incomplete filling, tilting, can be expensive, etc. Liquid epoxy may not be used to accurately control, for example, the height or thickness so there may be a need to overcast then grind at least the epoxy, pillars on a substrate and/or die drain in order to planarize three interfaces for the next step of bottom plating for the final input/output to a printed circuit board. The grinding can result in, for example, high Rds(on) of a MOSFET where the back metal of MOSFET die will be removed and low adhesive strength and delamination of bottom plating to a substrate. A heatslug can be attached on back metal of a MOSFET to avoid the issue above, however, there can be heatslug rotation during reflow and detached heatslugs during grinding.

The implementations described use the attachment of the die on the leadframe using die attach processing with desirable control on solder bond line thickness and little or no die rotation and/or tilting.

FIGS. 2A and 2B are diagrams that illustrate a variation of the device 100 shown in FIG. 1. FIG. 2B is a zoomed in illustration of a portion of the device 200 shown in FIG. 2A. As shown in FIG. 2A, the device 200 includes a leadframe 240 (e.g., a pre-plated leadframe) coupled to an interposer 210 via an interposer attach solder 242 (e.g., a ceramic attach solder) and a bottom conductive plate 244 (e.g., a copper conductive plate). In some implementations, the interposer 210 can be a ceramic substrate carrier. In some implementations, electrical connection to the leadframe 240 is routed through a filled via with a metallized contact pad where the metallized contact pad is connected through soldering or through conductive adhesive.

In this implementation, the device 200 includes a controller integrated circuit (IC) die 230 and an output integrated circuit (IC) die 235. Capacitors are defined, respectively, between the die 230, 235 and transmission lines 258 via the interposer 210. In some implementations, the transmission lines 258 can be defined by a conductive plate. In some implementations, different types of semiconductor die (e.g., a MOSFET die, an input integrated circuit (IC), etc.) can be included in the device 200.

Figure 3A:
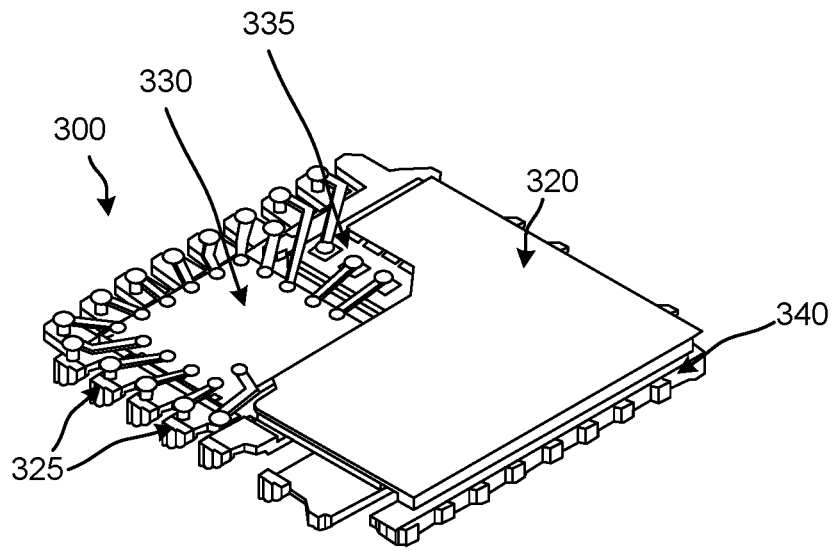
FIGS. 3A through 3C are diagrams illustrate a device that is another variation of the device shown in FIG. 1.
Figure 3B:
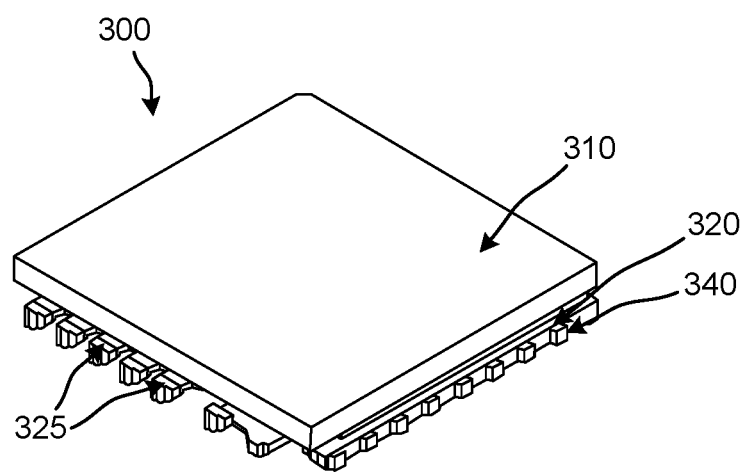
Figure 3C:
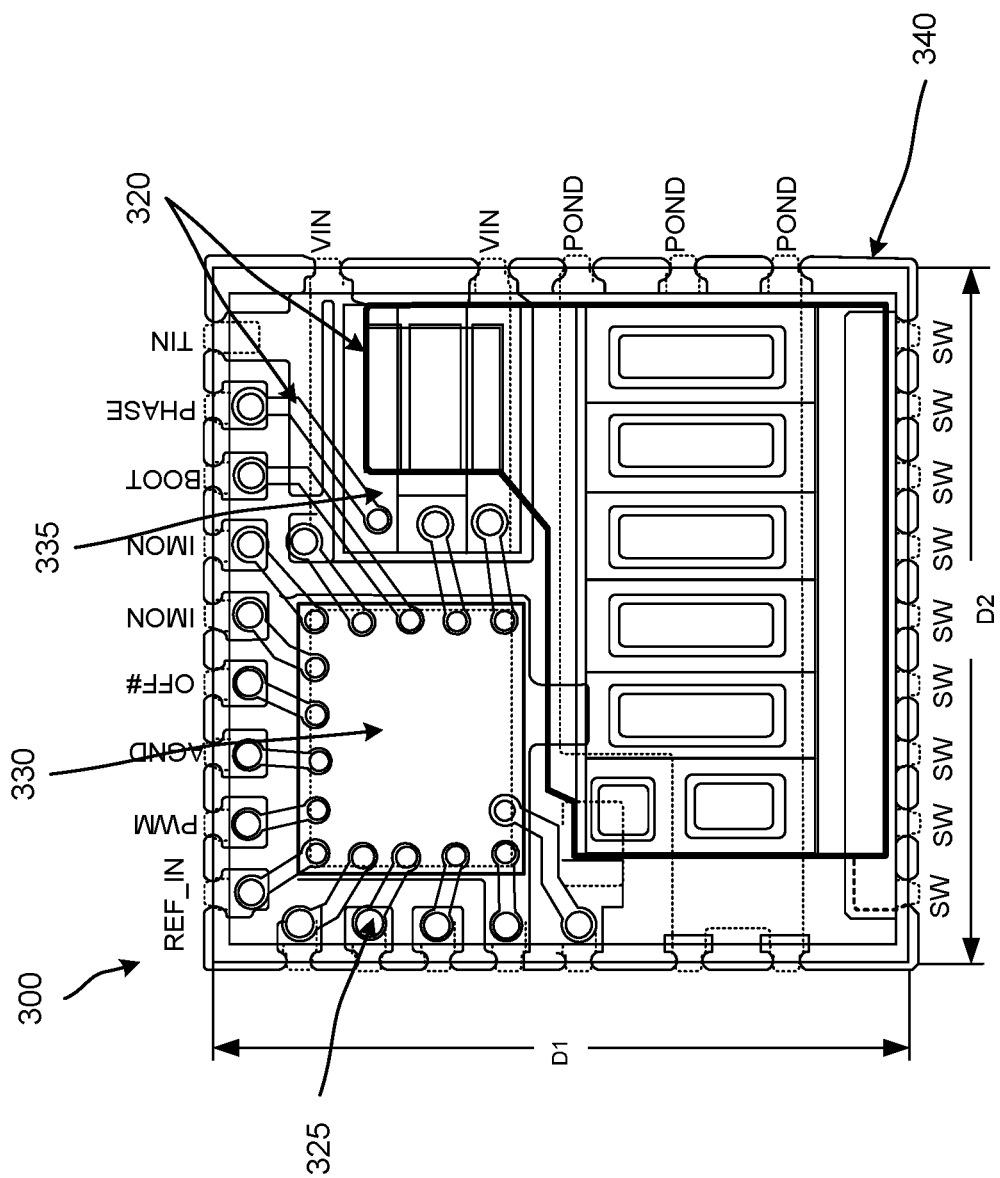

In some implementations, an electrical connection to the leadframe 240 from, for example, the output IC die 235, for example, can be routed through a via 246 (e.g., a filled via) and other components such as the ceramic attach solder 242m the bottom conductive plate 244, a top conductive plate 248, a bump attach solder 262, a conductive bump 264, and/or so forth. The same, or similar elements can be used to electrically connect the leadframe 240 to the controller IC die 230. In some implementations, the interposer 210 (e.g., substrate material) can be specifically ceramic for relatively high voltage isolation and the thickness of the interposer 210 can be based on a capacitance performance target FIGS. 3A through 3C are diagrams illustrate a device 300 that is yet another variation of the device 100 shown in FIG. 1. In these illustrations, a molding is not illustrated. FIG. 3A is a perspective view diagram that illustrates the device 300 with the interposer 310 removed so that a redistribution layer 320 can be seen. As shown in FIG. 3A, pillars 325 are coupled between portions of the redistribution layer 320 and the leadframe 340.

Semiconductor die 330, 335 coupled to the redistribution layer 320 and the leadframe 340 are shown. Although not shown in FIG. 3A or 3B, another semiconductor die can be disposed between the redistribution layer 320 and the leadframe 340. One or more of the semiconductor die 330, 335 (or other die) can include, for example, a HV or LV transistor, a FET and/or an IC. The semiconductor die 330 and/or 335 can be configured with a drain side facing toward the redistribution layer 320 or with a drain facing toward the leadframe 340. In some implementations, one or more of the semiconductor die 330, 335 can be an integrated circuited with one or more terminals or connections (e.g., input terminals or connections, output terminals or connections)

on only one side and insulated from either the leadframe 340 or the redistribution layer 320.

FIG. 3B is a perspective view that illustrates the device 300 with the interposer 310 disposed on (or coupled to) the redistribution layer 320. As shown, the redistribution layer 320 is disposed between and coupled to both the interposer 310 and the leadframe 340.

FIG. 3C is a diagram that illustrates various layers of device 300 overlaid on one another. The device 300 is configured as a quad flat no lead (QFN) device, but in some implementations, the device 300 may not be configured as a QFN device. In some implementations, a width D1 can be equal to a width D2 of the device 300. In some implementations, the width D1 can be less than or greater than the width D2 of the device 300. In some implementations, D1 and/or D2 can be on the order of a few millimeters (e.g., 3 mm, 5 mm, 8 mm, 10 mm). In some implementations, D1 and/or D2 can be less than a few millimeters (e.g., a fraction of a millimeter) or more than a few millimeters.

Figure 4A:
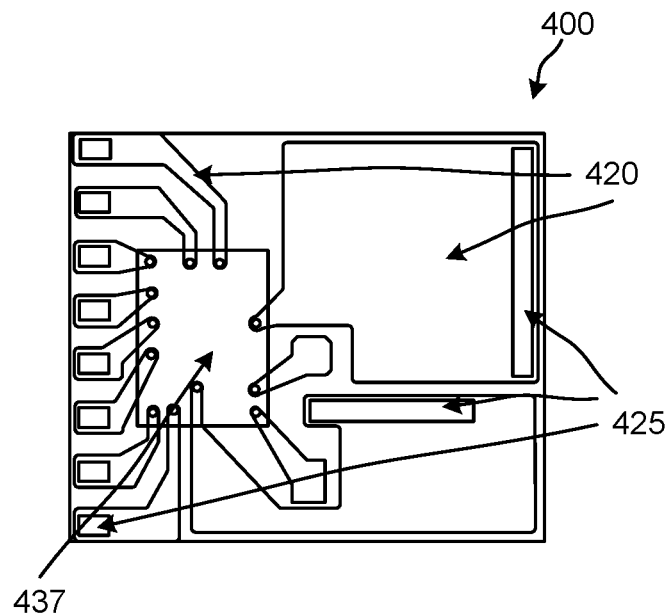
FIGS. 4A through 4E are diagrams illustrate a device that is yet another variation of the device shown in FIG. 1.

FIGS. 4A through 4D are diagrams illustrate a device 400 that is yet another variation of the device 100 shown in FIG. 1. The device 400 is configured as a QFN device, but in some implementations, the device 400 may not be configured as a QFN device. FIG. 4A is a diagram that illustrates several of the layers of the device 400 overlaid on one another. As shown in FIG. 4A, the device 400 includes a redistribution layer 420 and a pillar layer 425. As shown, a high-side FET (HS FET) 430, a low-side FET (LS FET) 435, and an integrated circuit (IC) die 437 are included in the device 400.

Figure 4B:
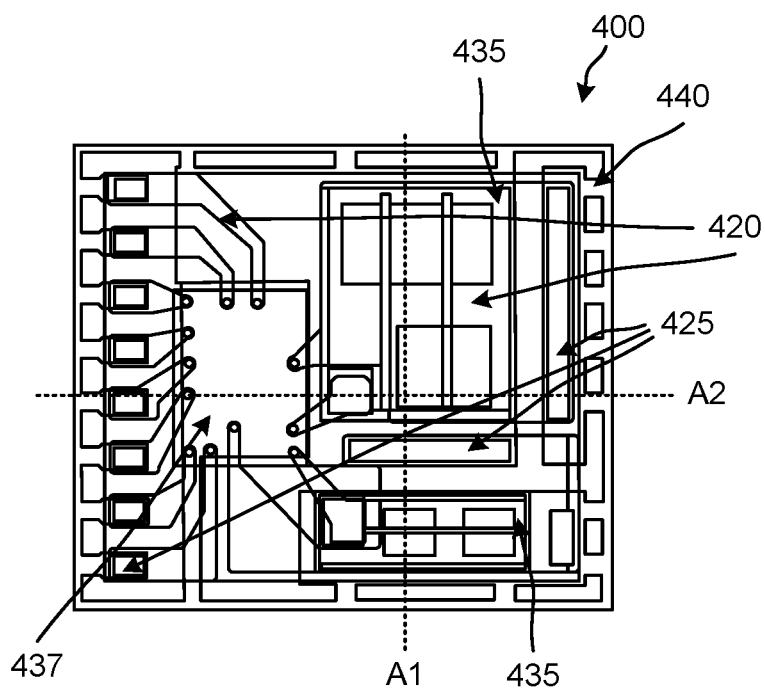

FIG. 4B is a diagram that also illustrates several layers of the device 400 overlaid on one another. FIG. 4B illustrates a leadframe 440, which is disposed below the redistribution layer 420 and electrically coupled to the redistribution layer 420 via the pillars 425. The pillar can be a copper pillar, a copper ball, a solder ball, and/or so forth, and can be an integral part of the interposer 410.

Figure 4C:
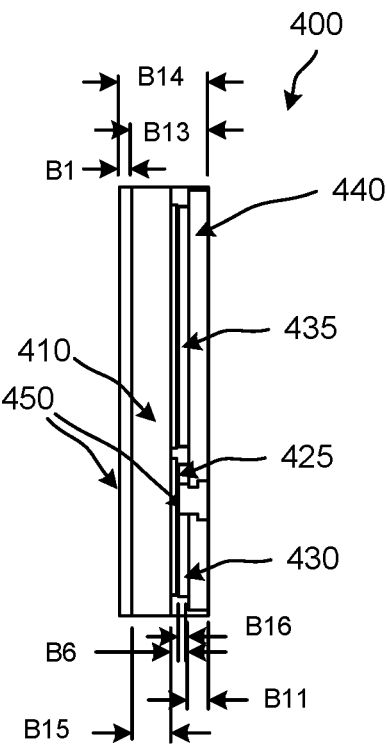

FIG. 4C is a diagram that illustrates a side view (e.g., a side cross-sectional view) of the device 400 (cut along line A1 in FIG. 4B). As shown in FIG. 4C, the high-side FET (HS FET) 430 and the low-side FET (LS FET) 435 are included in the device 400. An interposer 410 (which in this case is a metallized ceramic interposer) are coupled to the HS FET 430 and to the LS FET 435. A molding 450 is also shown in FIG. 4C. As shown in FIG. 4C, the chip (e.g., LS FET 435) is coupled via top and bottom connections between the interposer 410 and the leadframe 440. The exposed leadframe 440 can function as the final exposed pad connection for the final assembled product.

Figure 4D:
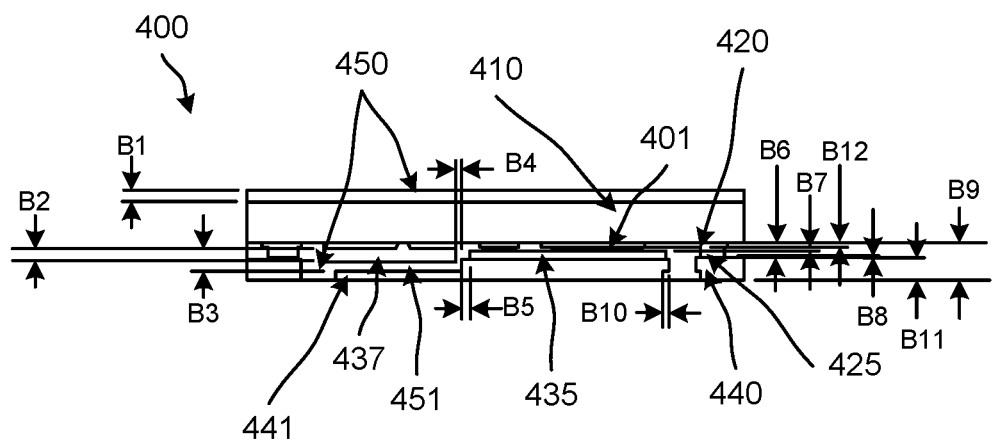

FIG. 4D is a diagram that illustrates another side view (e.g., a side cross-sectional view) of the device 400 (cut along line A2 in FIG. 4B). As shown in FIG. 4D, and integrated circuit (IC) is electrically coupled to the interposer 410. The IC has a bottom side that is insulated from the leadframe 440. FIG. 4D also illustrates an underfill. As shown in FIG. 4D, a pillar and a semiconductor die back (e.g., LS FET 435) can be coplanar. However, given potential variation, the final contact height can be controlled by the semiconductor die thickness.

In at least the implementations described in connection with FIGS. 4A through 4D, one or more semiconductor die (e.g., LS FET 435) can be coupled by top and bottom contacts to the leadframe 440 and the interposer 410, respectively. The coupling can be achieved using, for example, a solder, a conductive adhesive, and/or so forth.

In some implementations, one or more electrical connections from the interposer 410 to the leadframe 440 can be made using, for example, a pillar (e.g., a copper pillar), a ball (e.g., a copper ball, a solder ball), and/or so forth. The coupling can be achieved using, for example, a solder, a conductive adhesive, and/or so forth.

In some implementations, a semiconductor die (e.g., a single die, multiple die) can be coupled to the interposer 410 such that the interposer 410 is coplanar to a pillar (e.g., copper pillar), a protruded pillar, a ball, and/or so forth to allow for planar connection to one or more receiving areas on the leadframe 440.

Various dimensions related to the device 400 are illustrated in FIGS. 4C and 4D. As shown in FIG. 4D, a portion 451 of the molding 450 is disposed between a portion of the leadframe 440 and a portion of the IC die 437, which is electrically coupled to the redistribution layer 420. The portion 451 of the molding 450 can insulate the IC die 437 from the leadframe 440. The portion 451 of the molding 450 can be referred to as an underfill below the IC die 437. The portion 451 is disposed on a recessed portion 441 (e.g., an etched portion, a half portion) of the lead frame 440.

A solder 401 between one or more of the semiconductor die (e.g., LS FET 435) and the redistribution layer 420 is B7. As shown in FIG. 4D, the molding 450 has a thickness B1 that is less than a thickness of the interposer 410 and less than a thickness B9 from a bottom of the interposer 410 to a bottom of the leadframe 440 and a thickness B11 of the leadframe 440.

The redistribution layer has a thickness B12. The thickness of the redistribution layer 420 can be less than the thickness B11 of the leadframe and/or a thickness B2 of a conductive pillar 425.

In some implementations, the thickness B9 includes a vertical stack of at least the lead frame 440, the conductive pillar 425, the redistribution layer 420, and a solder (not labeled) between the conductive pillar 425 and the lead frame 440. Thickness B8 can be a thickness of the solder between the conductive pillar 425 and the lead frame 440. In some implementations, thickness B6 includes a vertical stack of at least the conductive pillar 425, the redistribution layer 420, and the solder between the conductive pillar 425 and the lead frame 440.

Thickness B3 is a distance between a bottom of the redistribution layer 420 and a top surface of the recessed portion 441 of the lead frame 440 below the IC die 437. Accordingly thickness B3 includes the portion 451 of the molding 450 and the IC die 437. The thickness B3 can be greater than, less than, or equal to the thickness B6.

Distance B4 is a distance between a corner of the recessed portion 441 and the IC die 437. Distance B5 is a distance between a corner of the recessed portion 441 and the LS FET 435. Distance B10 is a distance of an overhang within the lead frame 440.

In some implementations, thickness B13 (in FIG. 4C) includes a vertical stack of at least the lead frame 440, the conductive pillar 425, the redistribution layer 420, one or more solders, and the interposer 410. An overall thickness of the device 400 is illustrated as B14, which includes thickness B13 and the thickness of the molding 450 on the interposer 410. Thickness B15 is a thickness of the interposer 410.

In some implementations, a maximum thickness (or height) to width ratio of one or more of the conductive pillars 425 can be 1:1. In some implementations, the maximum thickness to width ratio of one or more of the conductive pillars 425 can be greater than 1:1 or less than 1:1. In some implementations, a maximum width of one or more of the conductive pillars 425 can be approximately 150 microns. In some implementations, the maximum width of one or more of the conductive pillars 425 can be less than 150 microns or greater than 150 microns. In some implementations, the thickness B2 of one or more of the conductive pillars 425 can be approximately 85 microns. In some implementations, the height of one or more of the conductive pillars 425 can be greater than or less than 85 microns.

In some implementations, the thickness B2 of the conductive pillars 425 can be at least equal to a thickness of a solder coupled to the interposer 410, a die thickness, and a thickness of a solder coupled to the redistribution layer 420.

Figure 4E:
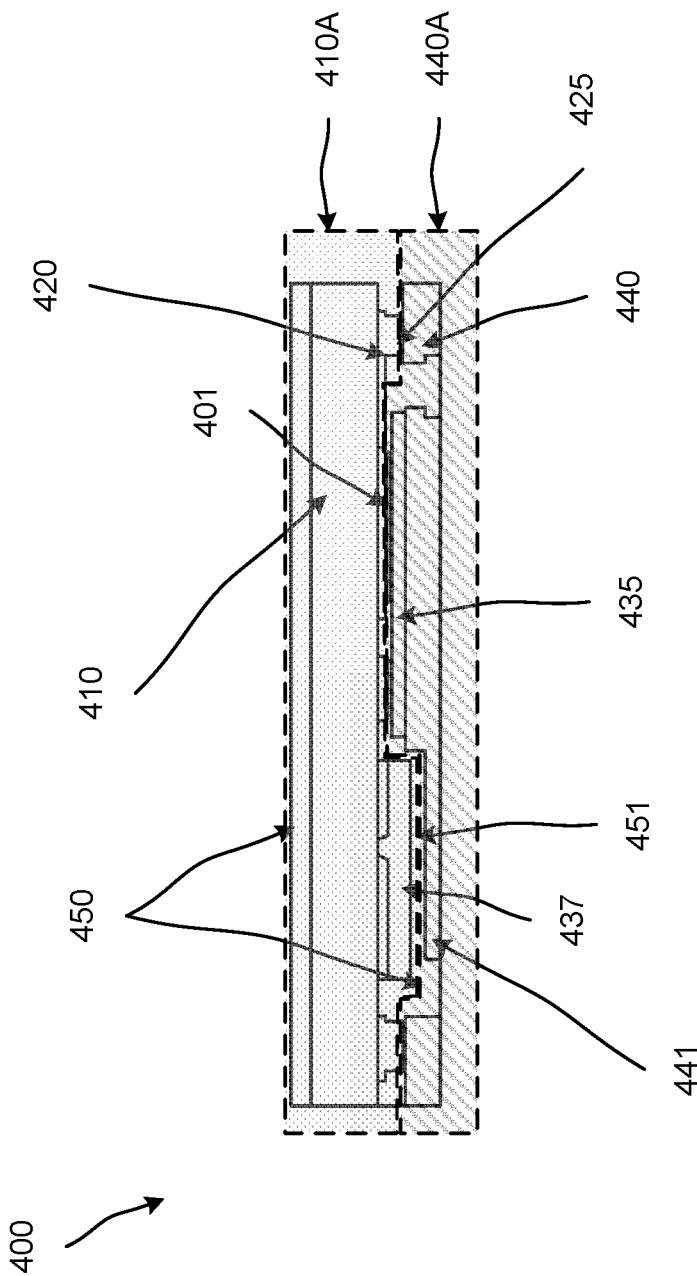

FIG. 4E illustrates different portions of the device 400 that can be combined to form the device 400. Specifically, during fabrication a pre-assembled leadframe 440A can be produced and combined during fabrication with a pre-assembled interposer 410A. The pre-assembled leadframe 440A can include semiconductor die 430, 435, and the leadframe 440. The pre-assembled interposer 440A can include semiconductor die 430, and the interposer 410.

In some implementations, B1, B2, B3, B5, B6, B7, B8, B10, and/or B16 can be a fraction of a millimeter (e.g., 0.02 mm, 0.03 mm, 0.05 mm, 0.06 mm, 0.09 mm, 0.10 mm, 0.11 mm, 0.12 mm, 0.20 mm), or greater than or less than a fraction of a millimeter. In some implementations, B9, B11, and/or B12 can be a fraction of a millimeter (e.g., 0.10 mm, 0.14 mm, 0.20 mm, 0.35 mm, 0.36 mm, 0.50 mm), or greater than (e.g., more than 1 mm) or less than a fraction of a millimeter. In some implementations, these sub-millimeter dimensions can be critical for operation in some applications.

In some implementations, B15 can be a fraction of a millimeter (e.g., 0.10 mm, 0.14 mm, 0.20 mm, 0.35 mm, 0.38 mm, 0.50 mm), or greater than or less than a fraction of a millimeter. In some implementations, B13 and/or B14 can be a fraction of a millimeter (e.g., 0.35 mm, 0.50 mm, 0.73 mm, 0.85 mm), or greater than (e.g., more than 1 mm) or less than a fraction of a millimeter. In some implementations, these sub-millimeter (or approximately millimeter) dimensions can be critical for operation in some applications.

Figure 5A:
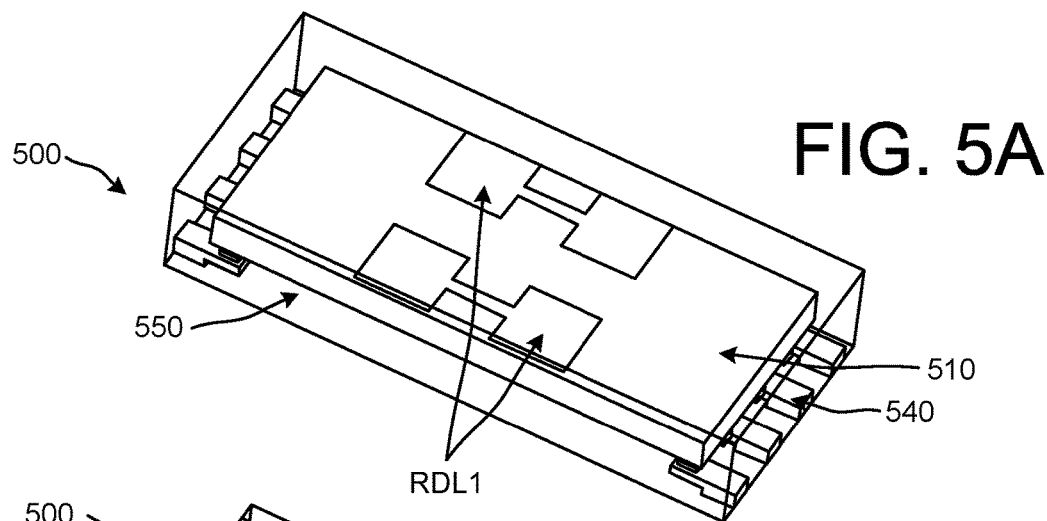

FIGS. 5A through 5F are diagrams illustrate a device 500 that is yet another variation of the device 100 shown in FIG. 1. The device 500 is configured as a QFN device, but in some implementations, the device 500 may not be configured as a QFN device. FIGS. 5A through 5E illustrate the device 500 with an etched leadframe 540 (which can be referred to as a leadframe with a recessed portion). FIG. 5F is a diagram that illustrates a side-cross-sectional view of the device 500 with a downset leadframe 540B.

Figure 5B:
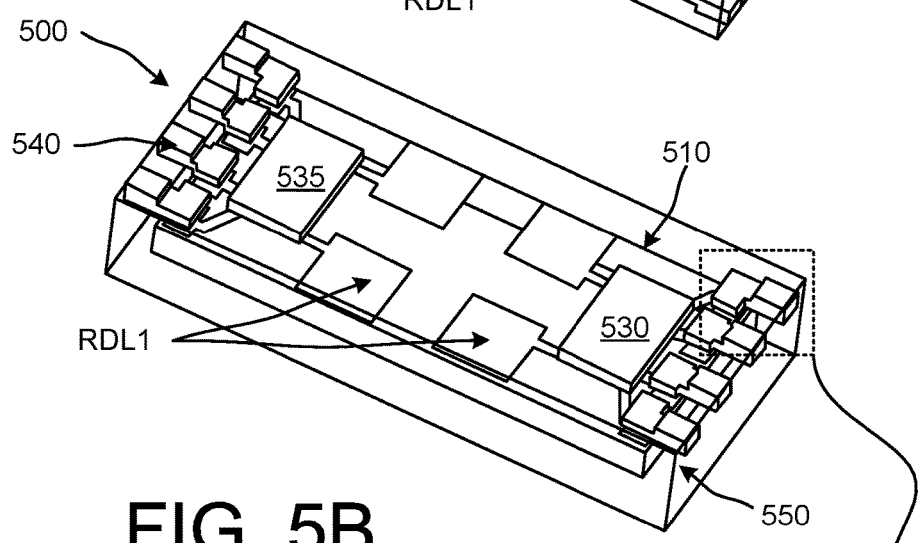

As shown in FIGS. 5A and 5B, capacitor plates are formed on opposite sides of the interposer 510. The capacitor plates are formed using a redistribution layer RDL1, RDL2 (also can be referred to as a trace layer). As shown in FIG. 5B, semiconductor die in a flip chip configuration are electrically coupled to the capacitor plates via the redistribution layer RDL1. A molding 550 is included in the device 500.

Figure 5C:
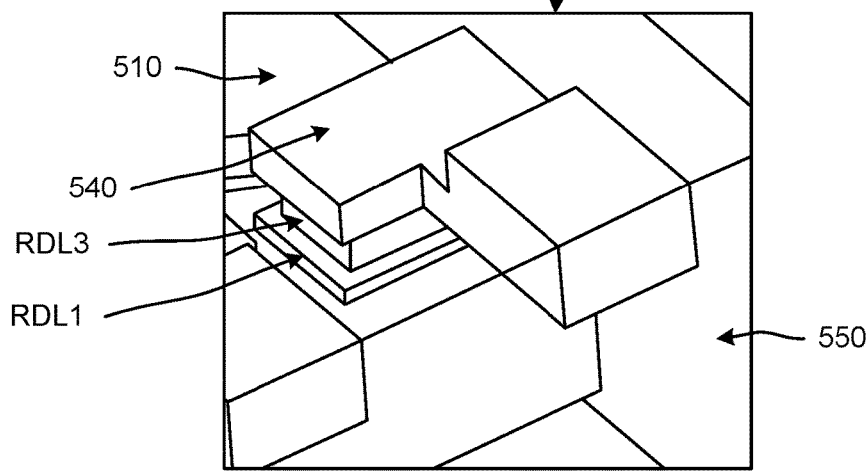

As shown in FIG. 5C, which is a zoomed in view of FIG. 5B, an etched leadframe 540 is included in the device 500. Multiple RDL layers (i.e., redistribution layer RDL1 and another metal layer RDL3) are disposed between the interposer 510 and the etched leadframe 540.

FIG. 5D is a diagram that illustrates an overlay of several of the layers of the device 500. As shown in FIG. 5D, the device 500 has a width E1 and a length E2. A distance E3 between edges of etched portions of the leadframe 540 is shown. As shown in FIG. 5D, a semiconductor die 535 can have a length E4 and a width E5. Semiconductor die 535 can have the same or different dimensions than semiconductor die 535. Dimension E6 and dimension E7 of the capacitive plates of the redistribution layer RDL1 can be the same or different. The area of one or more of the capacitive plates can be smaller than, the same as, or greater than an area of one or more of the semiconductor die 530, 535.

FIG. 5E is a diagram that illustrates a side cross-sectional view of the device 500 and the etched leadframe 540. A recess or etched portion of the leadframe 540 is illustrated in FIG. 5E. A thickness of the leadframe 540 is illustrated as thickness F1. Various conductive elements (which define a stack) between the interposer 510 and the leadframe 540 have a thickness F2, which can be less than, greater than or the same as thickness F1.

In these implementations, the interposer 510, which can be a ceramic substrate, can function as an interposer for relatively high-voltage isolation and signal transmission of integrated circuits through the capacitor plates. In some embodiments, electrical connections to the leadframe 540 (or portions thereof) can be defined using metallized contact pad traces, connected by soldering, conductive adhesive, and/or so forth. In some implementations, a point of contact between the interposer 510 and one or more portions of the leadframe 540 can be defined to ensure desirable vertical spacing of packaging structures. The etched leadframe 540 implementation (e.g., no-downset etched leadframe) can include the interposer 510 and multiple redistribution layers RDL1, RDL2, RDL3 as illustrated in FIGS. 5A through 5E, and the downset leadframe implementation can include the interposer 510 and a single redistribution layer as illustrated in FIG. 5F.

FIG. 5F is a diagram that illustrates a side cross-sectional view of the device 500 and the downset leadframe 540B. A downset portion of the leadframe 540B is illustrated in FIG. 5F. A thickness of the leadframe 540B is illustrated as thickness G1. In this implementation, various conductive elements (which define a stack) between the interposer 510 and the leadframe 540B is relatively thin (thinner than thickness F2) because the leadframe 540B is downset. A thickness G2 of the leadframe 540B is consistent along the leadframe 540B and the leadframe 540B includes inflection points or bends. An overall thickness of the device 500 is illustrated as thickness G3.

In some implementations, E1, E2, E3, and/or E4 can be a few millimeters (e.g., 1 mm, 2 mm, 4 mm, 8 mm, 9 mm, 10 mm), or a fraction of a millimeter. In some implementations, E5, E6, and/or E7 can be on the order of a millimeter (e.g., 0.8 mm, 1 mm, 1.15 mm, 1.2 mm, 1.5 mm), or a fraction of a millimeter (e.g., 0.2 mm, 0.4 mm, 0.6 mm). In some implementations, these millimeter or sub-millimeter dimensions can be critical for operation in some applications.

In some implementations, G1, G2, G4, G5, G6, F1, and/or F2 can be a fraction of a millimeter (e.g., 0.2 mm, 0.22 mm, 0.3 mm, 0.5 mm, 0.7 mm), or greater than a fraction of a millimeter or less than a fraction of a millimeter. In some implementations, G3 can be on the order of a millimeter (e.g., 0.8 mm, 1 mm, 1.2 mm, 1.5 mm, 2 mm), a fraction of a millimeter, or a few millimeters. In some implementations, these millimeter or sub-millimeter dimensions can be critical for operation in some applications.

Figure 6A:
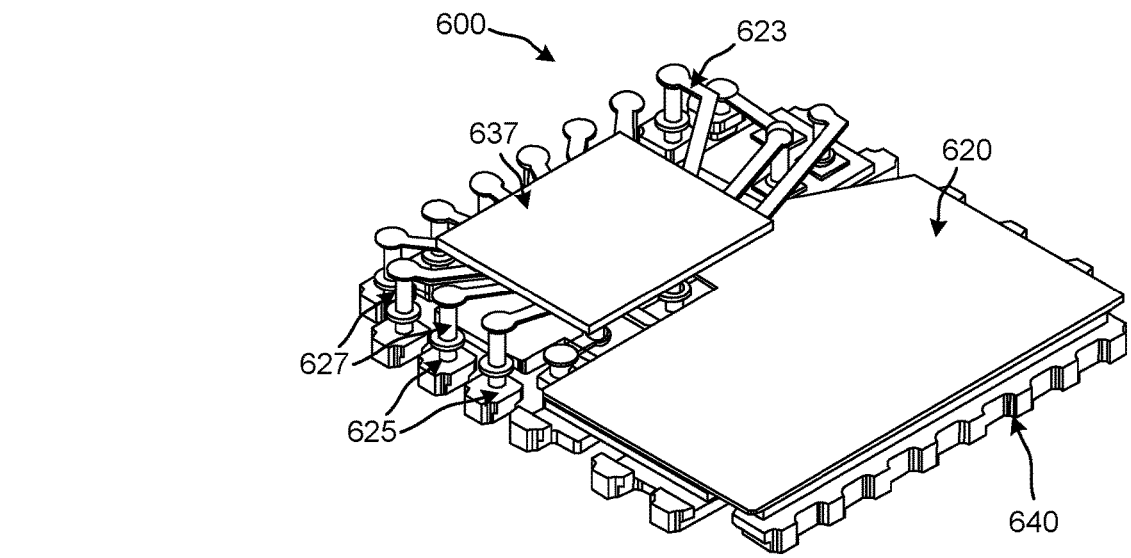
FIGS. 6A through 6C are diagrams illustrate a device that is yet another variation of the device shown in FIG. 1.
Figure 6B:
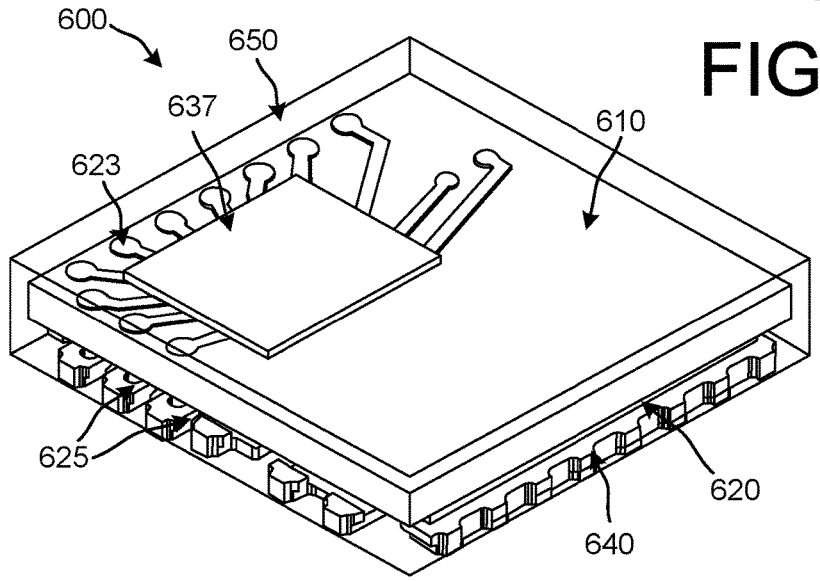
Figure 6C:
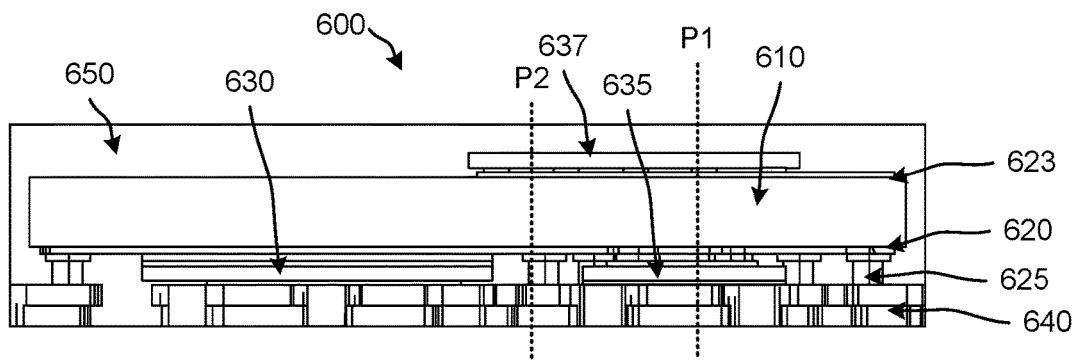

FIGS. 6A through 6C are diagrams illustrate a device 600 that is yet another variation of the device 100 shown in FIG. 1. In these illustrations, semiconductor die 630, 635, and 637 and a molding 650 is included in the device 600. Additional or less semiconductor die can be included in the device 600.

In some implementations, the semiconductor die 635 can be a controller or another type of integrated circuit.

FIG. 6A is a perspective view diagram that illustrates the device 600 with the interposer 610 removed so that a redistribution layer 620, pillars 625, vias 627, and a redistribution layer 623 can be seen. Pillars 625 are disposed between the redistribution layer 620 and the leadframe 640, and the vias 627 are coupled between the redistribution layer 620 and the redistribution layer 623.

FIG. 6B is a perspective view that illustrates the device 600 with the interposer 610 disposed on (or coupled to) the redistribution layer 620. As shown, the redistribution layer 620 is disposed between and coupled to both the interposer 610 and the leadframe 640. In this implementation, the interposer 610 is disposed between the redistribution layer 623 and the redistribution layer 620. The vias 627 are disposed within the interposer 610 and are coupled between the redistribution layer 620 and the redistribution layer 623. The semiconductor die 637 is coupled to the redistribution layer 623.

FIG. 6C is side cross-sectional view that illustrates various layers of device 600 stacked on one another. The device 600 is configured as a quad flat no lead (QFN) device, but in some implementations, the device 600 may not be configured as a QFN device. In this view, a full stack can be seen. Molding 650, semiconductor die 637, redistribution layer 623, interposer 610, redistribution layer 620, semiconductor die 635, and leadframe 640 are along line P1. Also, molding 650, semiconductor die 637, redistribution layer 623, interposer 610, redistribution layer 620, pillar 625, and leadframe 640 are along line P2. Various solders, and/or so forth are also included in the stack. Various solders, and/or so forth are also included in the stacks along lines P1 and P2.

Figure 7A:
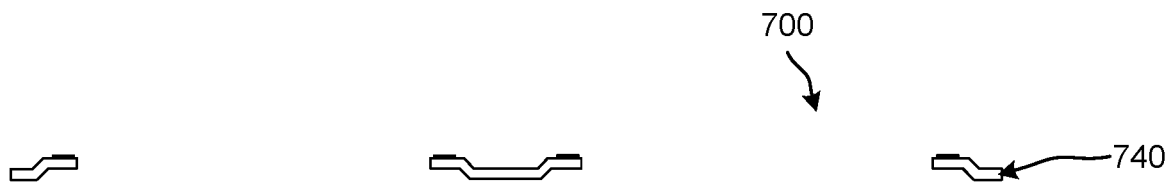
FIGS. 7A through 7E illustrate a process for producing a device as described herein.
Figure 7B:
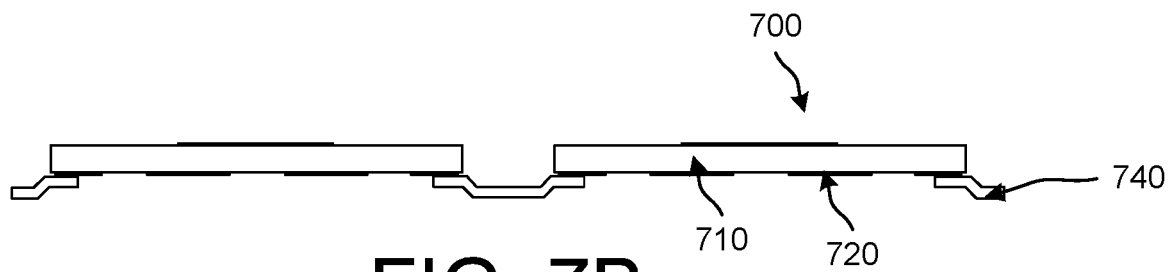

FIGS. 7A through 7E illustrate a process for producing a device 700 (or similar device such as device 100 shown in FIG. 1) as described herein. As shown in FIG. 7A, a coupling material (e.g., a solder, an adhesive) (not labeled) is disposed on (e.g., printed on) a leadframe 740 (or a portion thereof). As shown in FIG. 7B, an interposer 710 is coupled to the leadframe 740. In this implementation, the leadframe 740 includes downset portion. If the coupling material is a solder, the solder can be re-flowed. If the coupling material is an adhesive, the adhesive can be cured.

Figure 7C:
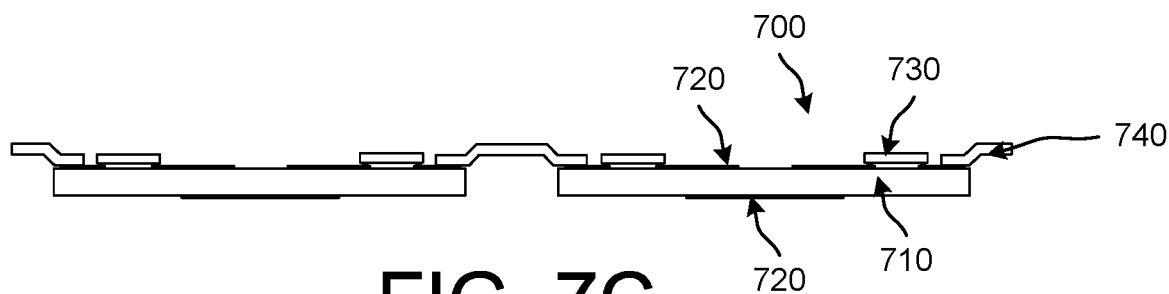

As shown in FIG. 7C, one or more semiconductor die 730 (only was in labeled in this diagram) are attached (e.g., flip chip attached, attached with a drain towards the interposer 710, attached with source or gate toward the interposer 710) to one or more of the redistribution layers 720 coupled to one or more sides of the interposer 710. The one or more redistribution layers 720 can define parallel plates of the capacitor around the interposer 710. The one or more semiconductor die 730 can be attached using a coupling material (not labeled), which can be reflowed and/or cured. In some implementation, if a flux residue is formed, the flux can be cleaned.

Figure 7D:
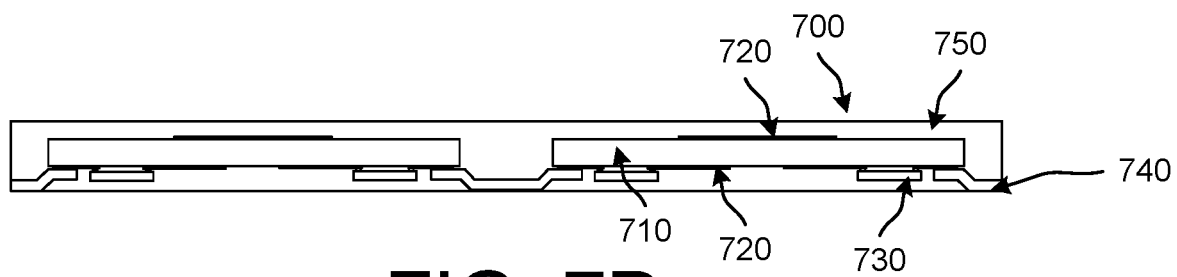
Figure 7E:
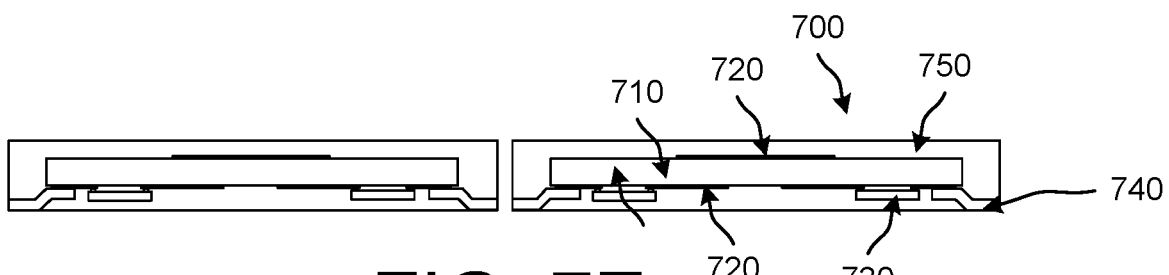
Figure 8A:
FIGS. 8A through 8E illustrate another process for producing a device as described herein.
Figure 8B:
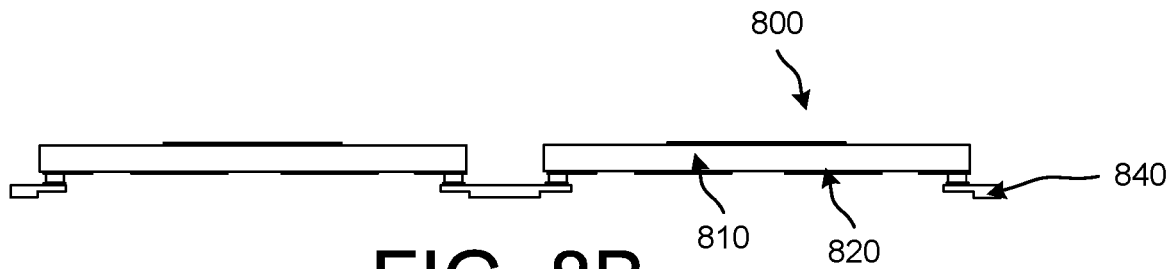
Figure 8C:
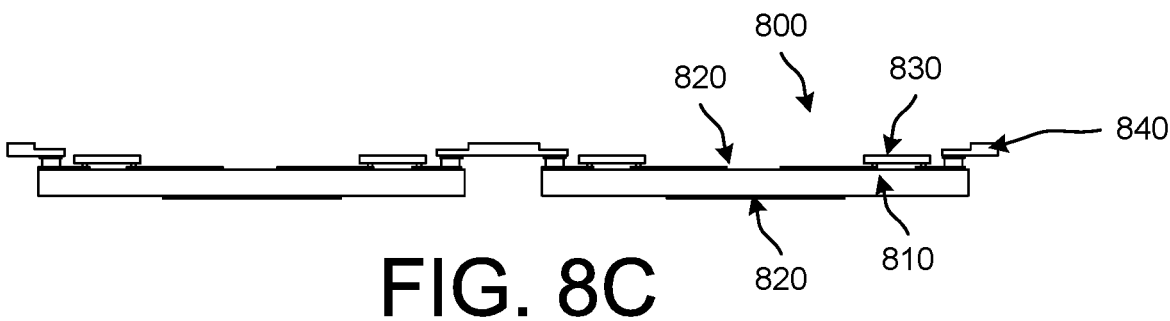
Figure 8D:
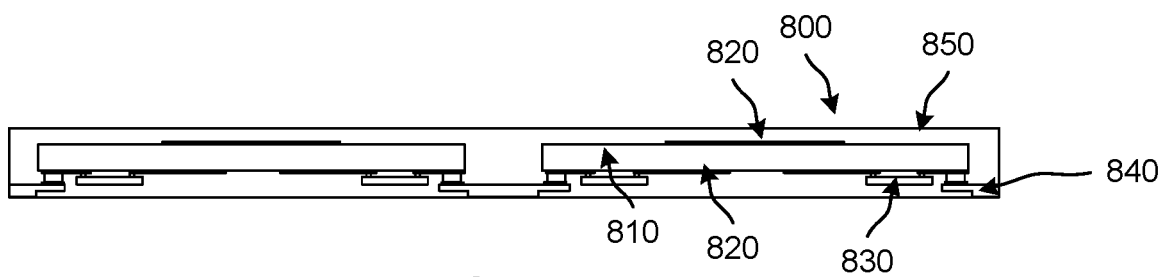
Figure 8E:
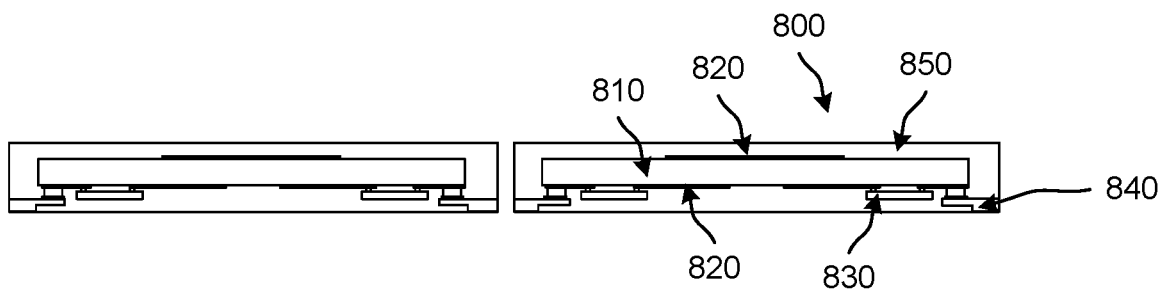

As shown in FIG. 7D, transfer molding to include a molding 750 in the device 700 can be performed. As shown in FIG. 7E, the device 70 can be singulated from other devices (not labeled) using a separation method such as sawing or dicing. In some implementations, testing of the device 700 can be performed.

FIGS. 8A through 8E illustrate another process for producing a device 800 (or similar device such as device 100 shown in FIG. 1) as described herein. In this implementation, the leadframe 740 includes an etched or recessed portion. The process shown in FIGS. 8A through 8E can be the same as the processing described in connection with FIGS. 7A through 7E.

Figure 9A:
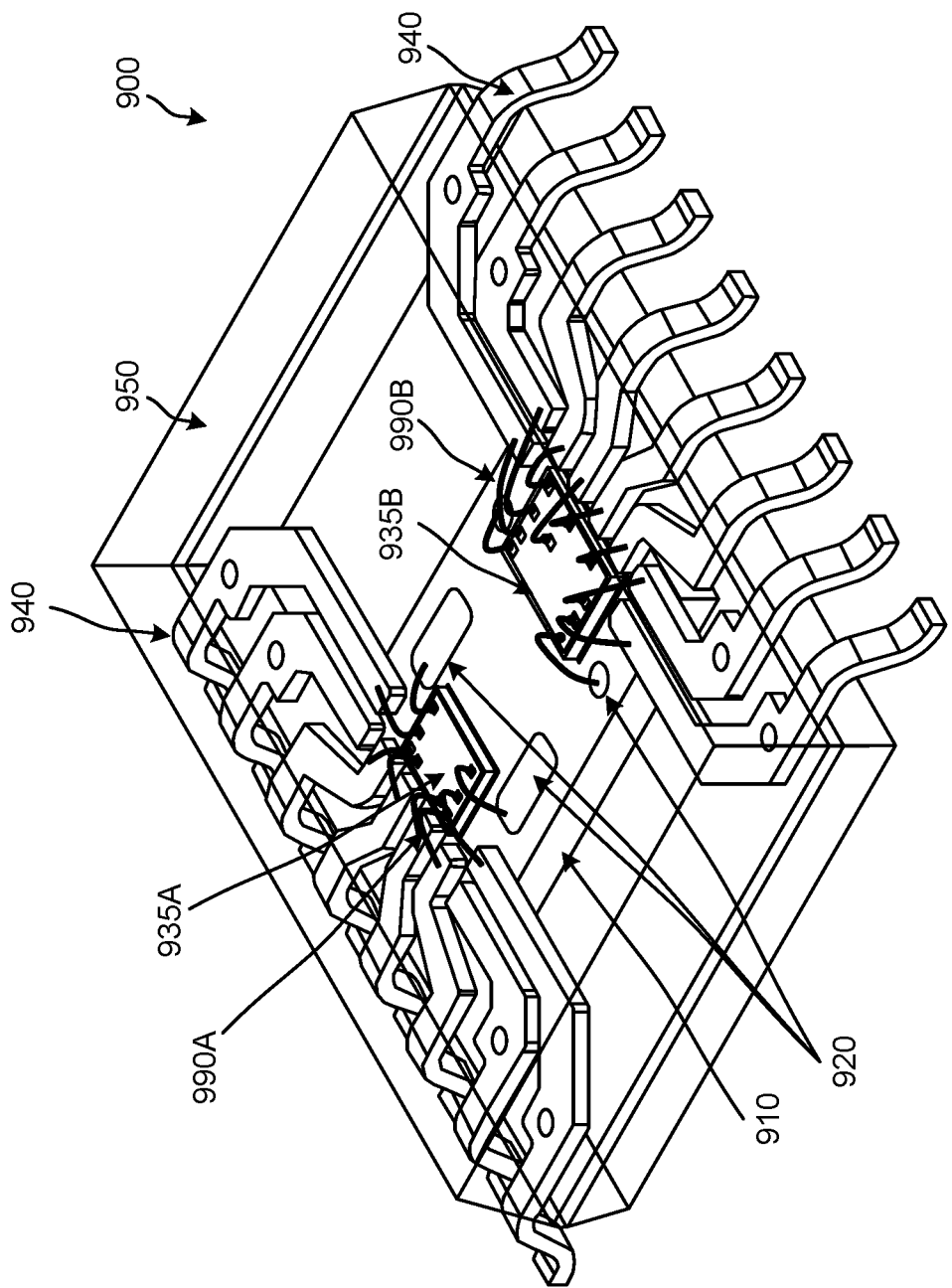
FIGS. 9A through 9C illustrate another implementation of a device.
Figure 9B:
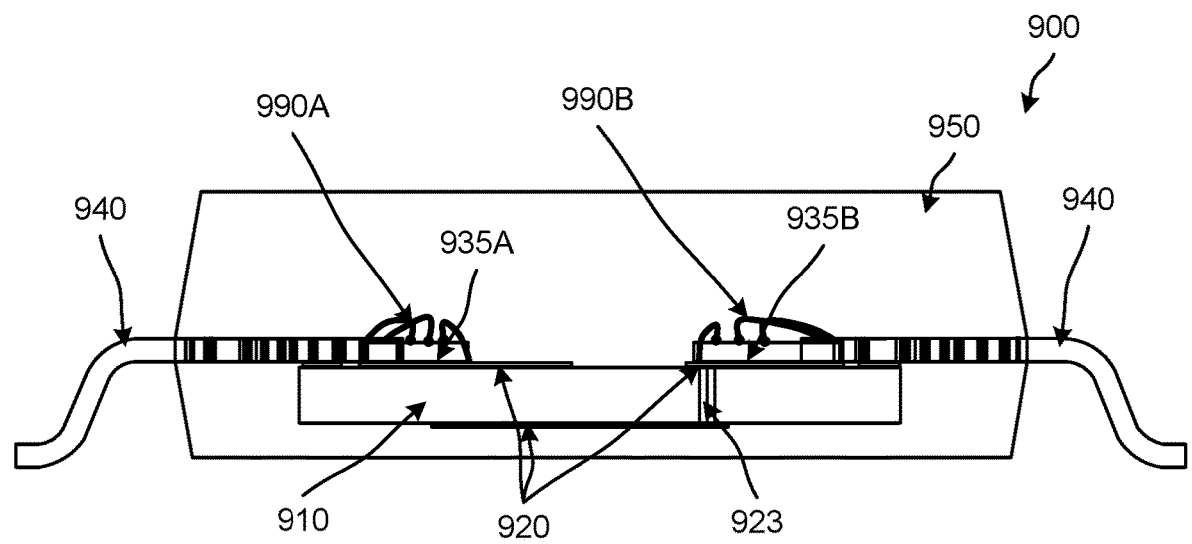
Figure 9C:
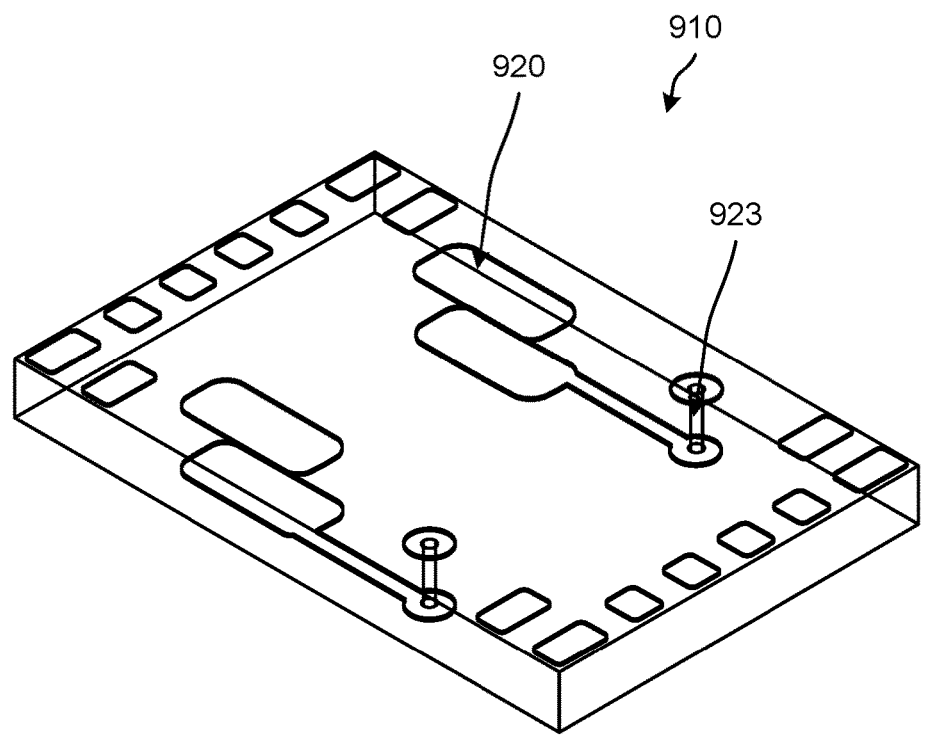

FIGS. 9A through 9C illustrate another implementation of a device 900. The device 900 can be a small outline integrated circuit (SOIC) galvanic isolator.

As shown in FIG. 9A, the device 900 includes an interposer 910 with a redistribution layer 920 and through-hole vias 923 (not shown in FIG. 9A). A leadframe 940 is coupled to top portions of the redistribution layer 920 using a coupling mechanism such as a solder. One or more wirebonds 990A, 990B (e.g., copper wirebonds, gold wirebonds) can be coupled between at least some portions of the leadframe 940 and semiconductor die 935A, 935B. The semiconductor die 935A, 935B can be coupled to the interposer using an adhesive (e.g., a non-conductive, low bleed adhesive). In some implementations, a molding can be, for example, an epoxy mold compound.

FIG. 9B is a side view of the device 900. As shown in FIG. 9B, the redistribution layer 900 defines a top and bottom of a capacitor across the interposer 910. One of the semiconductor die 935B is coupled to the bottom capacitive plate (which is a part of the redistribution layer 920 on the bottom of the interposer 910) using at least one of the vias 923, a portion of the redistribution layer 920 on top of the interposer 910, and at least one of the wirebonds 990B. One of the semiconductor die 935A is coupled to the top capacitive plate (which is a part of the redistribution layer 920 on the top of the interposer 910) using at least one of the wirebonds 990A.

FIG. 9C illustrates a perspective view of the interposer 910. In this perspective view, locations (or areas) of the redistribution layer 920 (which define contacts for the leadframe 940, top capacitive plates, bottom capacitive plates, and/or so forth), and the vias 923 can be readily identified.

Figure 10A:
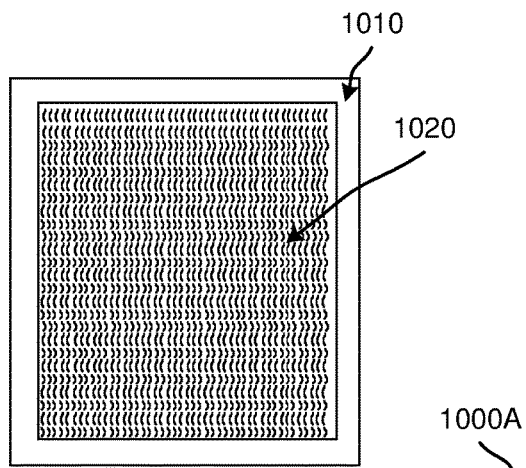
FIGS. 10A through 10N are diagrams that illustrates yet another process for producing a device.
Figure 10B:
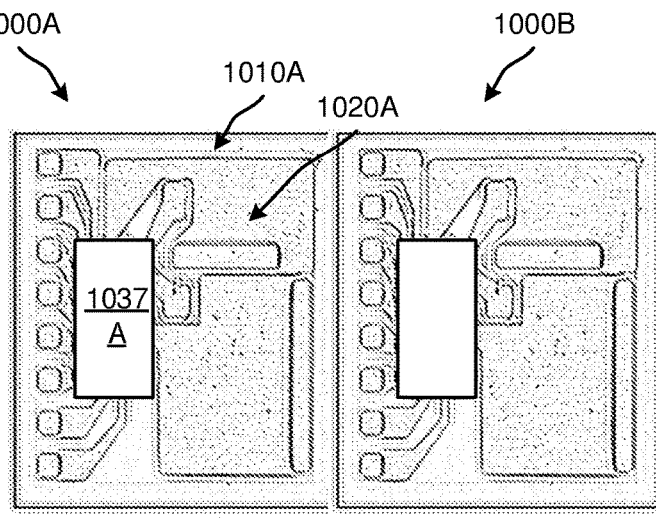
Figure 10C:
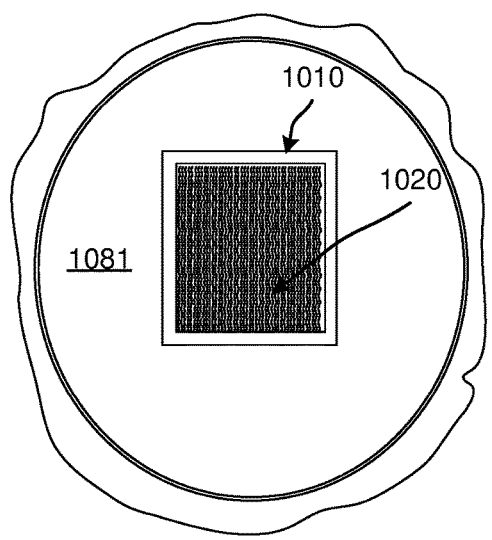
Figure 10D:
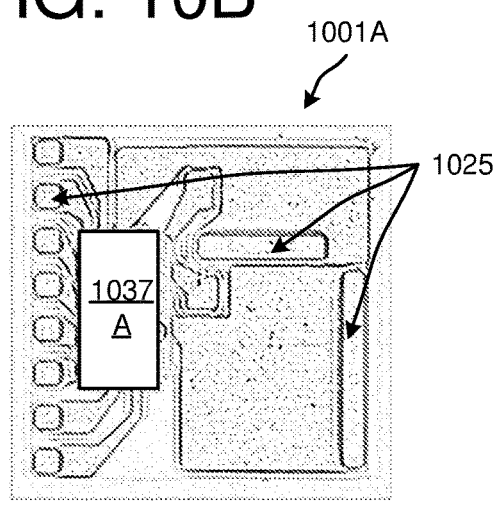
Figure 10N:
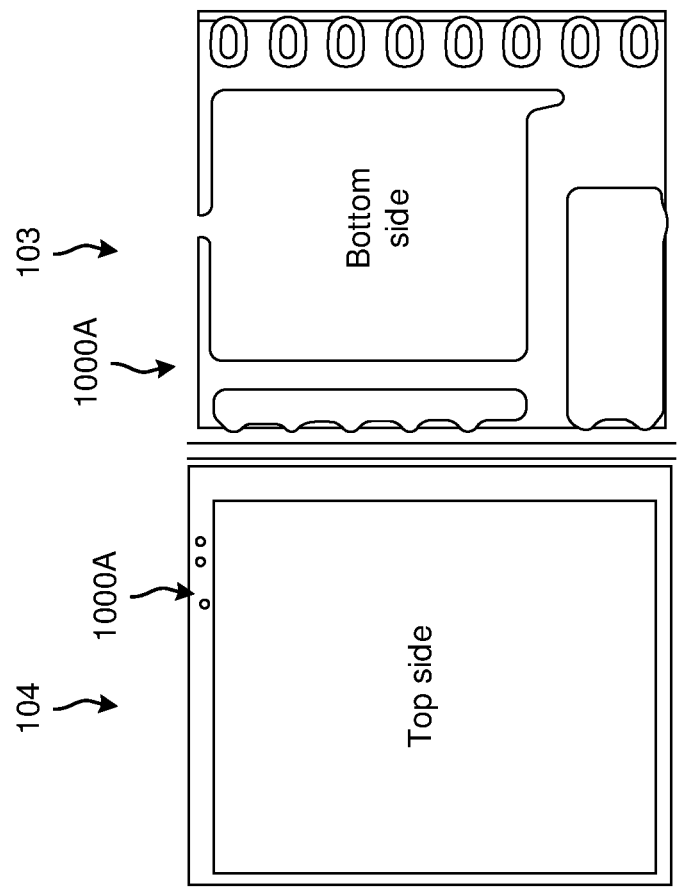

FIGS. 10A through 10N is a diagram that illustrates yet another process for producing a device (e.g., device 100 shown in FIG. 1) as described herein. The various process steps associated with the process flow of inter-poser pre-assembly are shown in FIGS. 10A through 10D. The various process steps associated with final unit assembly are illustrated in FIGS. 10E through 10N.

FIG. 10A is a diagram that illustrates a redistribution layer 1020 coupled to an interposer 1010. In this diagram, redistribution layers associated with hundreds of devices are shown. In some implementations, the redistribution layer 1020 can be coupled to the interposer 1010 using one or more coupling mechanism such as a solder. In some implementations, an OSP treatment can be performed on the redistribution layer 1020.

FIG. 10B is a diagram that illustrates a semiconductor die 1037A coupled to the redistribution layer 1020A associated with one of the devices from FIG. 10A, which is labeled as device 1000A. This diagram illustrates an intermediate stage of a portion of the device 1000A. In some of the figures intermediate stages and/or components associated with the device 1000A will be labeled and will be designated with the letter "A" to clarify their relationship to device 1000A.

As shown in FIG. 10B, the redistribution layer 1020A is coupled to an interposer 1010A of the device 1000A. After the semiconductor die 1037A is coupled to the redistribution layer 1020A, a reflow process can be performed. The device 1000A is illustrated adjacent to another device 1000B.

Semiconductor die 1037A can be coupled to the redistribution layer 1020A using one or more coupling mechanism such as a solder. In some implementations, the semiconductor die 1037A can have a drain, a source and/or a gate let me coupled directly to the redistribution layer 1020A so that a drain, a source and/or the gate are facing toward the redistribution layer 1020A and the interposer 1010A. In some implementations, the semiconductor die 1037A can be an integrated circuit without a backside drain.

As shown in FIG. 10C, the interposer 1010 can be tape mounted to a tape 1081. After being tape mounted, individual devices (e.g., device 1000A) can be singulated. The singulated component can be referred to as a pre-assembled interposer 1001A, which is illustrated in FIG. 10D. The pre-assembled interposer 1001A includes the interposer 1010A, the redistribution layer 1020A and the semiconductor die 1037A all in a singulated form.

The preassembled interposer 1001A can include one or more conductive pillars 1025A. In some implementations, the conductive pillars 1025A can be defined after the redistribution layer 1020 is formed on the interposer 1010 (or after one or more semiconductor die are attached to the redistribution layer 1020). In some implementations, a planarization process (e.g., a buffing process) can be implemented to define the height or thickness of the conductive pillars. In some implementations, one or more conductive pillars 1025A can be formed using, for example, a plating process.

FIG. 10E illustrates leadframe structures that are coupled together for many devices. FIG. 10F illustrates a leadframe 1040A for the device 1000A with solder portions 1022A printed on the leadframe 1040A. A recess 1041A within the leadframe 1040A is defined so that the semiconductor die 1037A can be aligned with the recess 1041A during assembly of the device 1000A.

FIG. 10G illustrates semiconductor die 1035A and 1030A coupled to the leadframe 1040A via at least some of the solder portions 1022A. In this implementation, the semiconductor die 1035A and 1030A are a lowside FET and a highside FET, respectively. The semiconductor die 1035A, 1030A have drain sides down, coupled to the solder portions 1022A, and facing toward the leadframe 1040A so that sources and gates of the semiconductor die 1035A, 1030A are facing up and out of the figure.

The solder portions 1022A that are exposed at this stage may be coupled to conductive pillars 1025 included in, for example, the pre-assembled interposer 1001A and shown in, for example, FIG. 10D.

FIG. 10H illustrates solder 1036A, 1038A disposed on (e.g., printed on) top of the semiconductor die 1035A and 1030A, respectively. FIG. 10H illustrates a pre-assembled leadframe 1002A of the device 1000A.

The pre-assembled interposer 1001A of the device 1000A formed using at least process steps FIGS. 10A through 10D can be combined with the pre-assembled leadframe 1002A of the device 1000A formed using at least process steps FIGS. 10E through 10H to defined the structure shown in FIG. 10I. FIG. 10I illustrates a backside of the interposer 1010A as the pre-assembled interposer 1001A (shown in FIG. 10D) is flipped over and attached so that the semiconductor die 1037A, 1035A, 1030A are disposed between the leadframe 1040A and the interposer 1010A. The semiconductor die 1037A, 1035A, 1030A are illustrated with dashed lines so that the orientation of the structures can be more readily discerned.

When the pre-assembled interposer 1001A and the pre-assembled leadframe 1002A are combined, the semiconductor die 1037A can be aligned with the recess 1041A (not shown in FIG. 10I). Also, when the pre-assembled interposer 1001A and the pre-assembled leadframe 1002A are combined, the conductive pillars 1025A can be aligned with the exposed solder portions 1022A (not shown in FIG. 10I). After the pre-assembled interposer 1001A and the pre-assembled leadframe 1002A are combined, a reflow process can be performed.

During the combination of the pre-assembled interposer 1001A with the pre-assembled leadframe 1002A, the pre-assembled leadframe 1002A can still remain coupled with other leadframes 1040 (and pre-assembled leadframes). The pre-assembled interposer 1001A, which is singulated, can be combined with the pre-assembled leadframe 1002A while coupled with other leadframes 1040. In some implementations, the pre-assembled leadframe 1002A can be singulated before being combined with the pre-assembled interposer 1001A. In some implementations, the pre-assembled leadframe 1002A can be singulated and combined with the pre-assembled interposer 1001A while the pre-assembled interposer 1001A remains attached to other the pre-assembled interposers.

A molding process (e.g., a transfer molding process) can be performed to couple a molding 1050 to the devices as shown in FIG. 10J. The molding (or interposer) side is shown in side 103 and the leadframe side is shown in side 104 after the molding process is performed.

FIG. 10K illustrates conductive plating 1045A disposed on the leadframe 1040A (not shown in FIG. 10K) of the device 1000A. Accordingly FIG. 10K illustrates the leadframe side 104.

FIG. 10L illustrates interposers 1010 (e.g., interposer 1010A) exposed after grinding the molding 1050. Accordingly FIG. 10L illustrates the molding or interposer side 103. In some implementations, the molding 1050 may not be removed (or may not be entirely removed) to expose the interposers 1010.

Figure 10M:
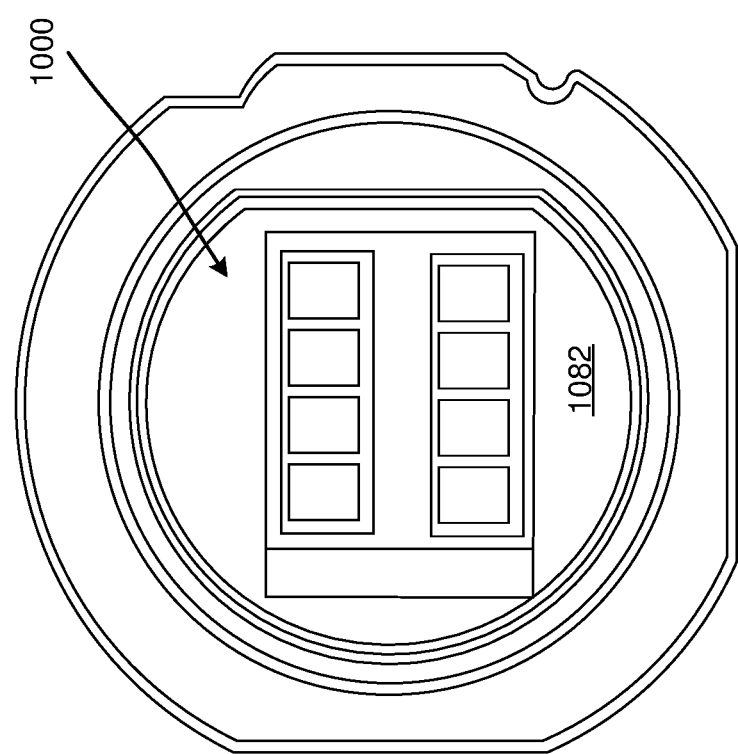

As shown in FIG. 10M, the devices 1000 can be tape mounted to a tape 1082. After being tape mounted, individual devices (e.g., device 1000A) that include the pre-assembled interposer 1001A and the pre-assembled leadframe 1002A can be singulated. The leadframe side 103 (also referred to as a bottom side) of the device 1000A and the molding (or interposer) side 104 (also referred to as a top side) of the device 1000A are shown in FIG. 10N.

Figure 11:
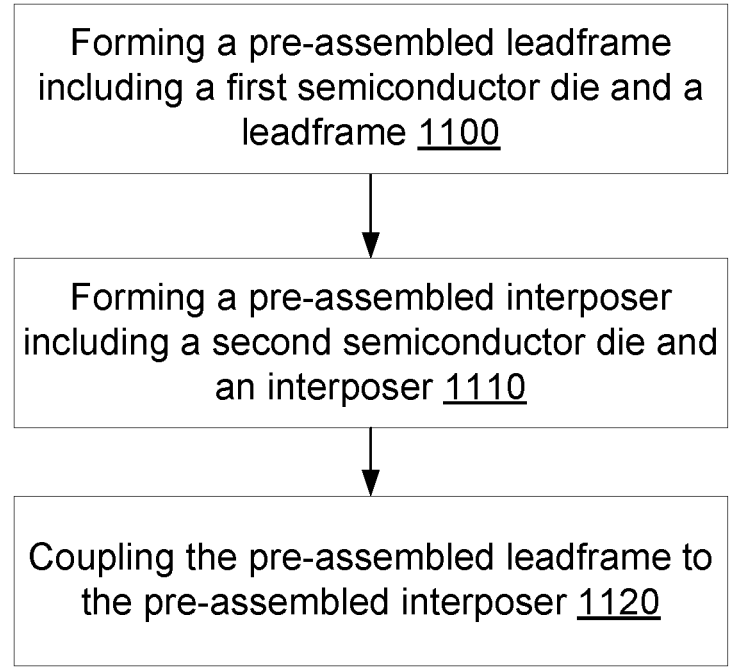
FIG. 11 is a flowchart that illustrates a method for making one or more of the devices described herein.

FIG. 11 is a flowchart that illustrates a method for making one or more of the devices described herein. As shown in FIG. 11, the can include forming a pre-assembled leadframe including a first semiconductor die and a leadframe (block 1100). In some implementations, the pre-assembled leadframe can be formed as described above in connection with at least FIGS. 10A through 10D.

The method can also include forming a pre-assembled interposer including a second semiconductor die and an interposer (block 1110). In some implementations, the pre-assembled interposer can be formed as described above in connection with at least FIGS. 10E through 10H.

The method can also include coupling the pre-assembled leadframe to the pre-assembled interposer (block 1120). In some implementations, the pre-assembled leadframe can be coupled to the pre-assembled interposer as described in connection with at least FIG. 10I. Additional processing steps can be performed on the combined device as described in at least FIGS. 10J through 10N.

Figure 12A:
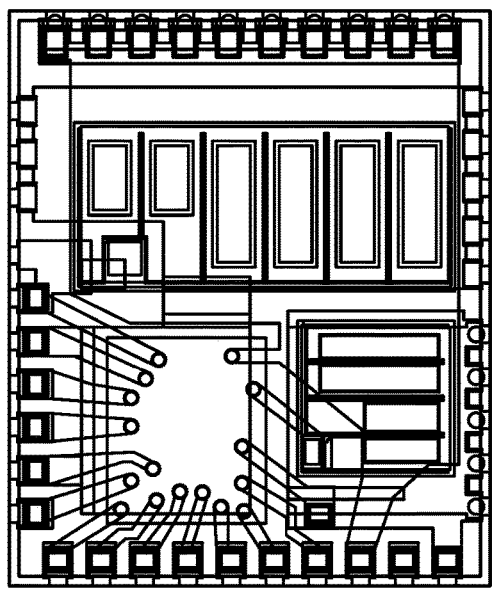
FIGS. 12A through 12D are diagrams that illustrate yet another example device.
Figure 12B:
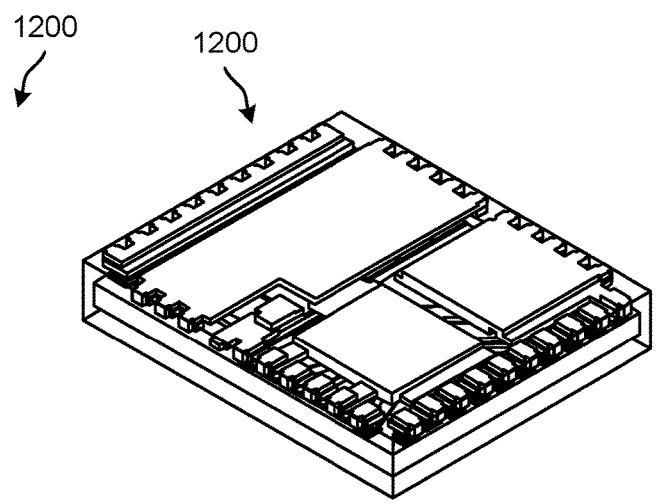
Figure 12C:
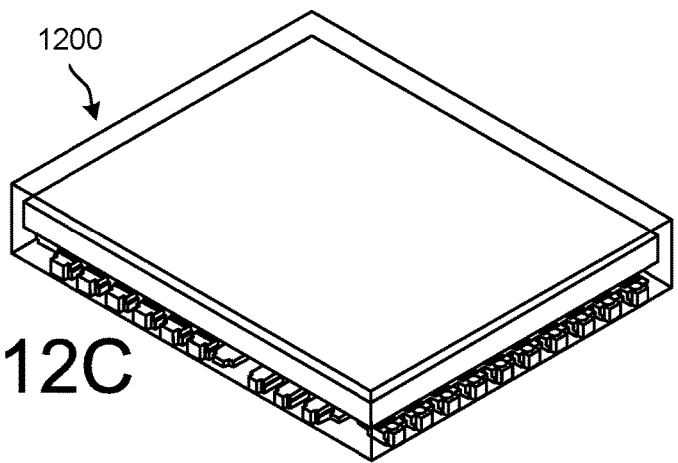
Figure 12D:
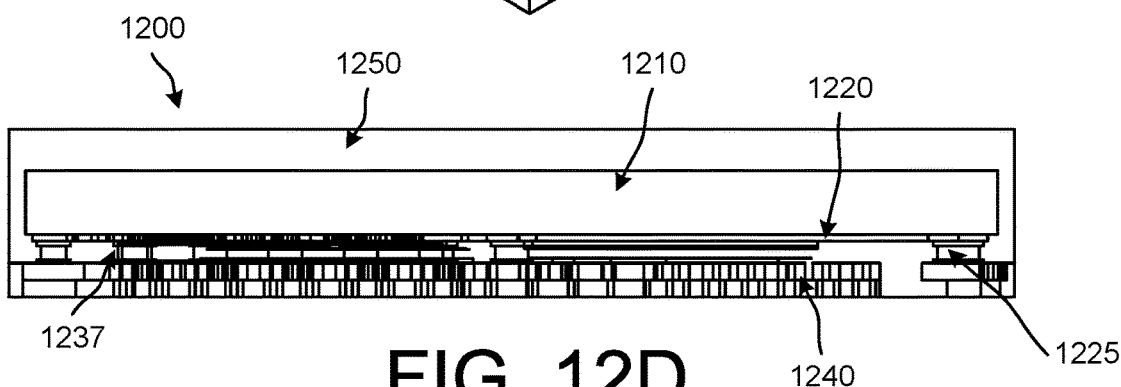

FIGS. 12A through 12D are diagrams that illustrate a device 1200 that is yet another variation of the device 100 shown in FIG. 1. FIGS. 12A through 12C illustrate various view of the device 1200 and FIG. 12D (which is labeled) illustrates a side view of the device 1200. The device 1200 includes a redistribution layer 1220, a pillar layer 1225, at least one die 1237 (e.g., a lowside FET, a highside FET, an IC), a leadframe 1240, an interposer 1210, and a molding 1250.

In some implementations, the pre-assembled interposer can be singulated before coupling the pre-assembled interposer to the pre-assembled leadframe. In some implementations, the pre-assembled interposer can be singulated before coupling the pre-assembled interposer to the pre-assembled leadframe without signulating the pre-assembled leadframe.

In some implementations, the method can include forming a redistribution layer including a plurality of traces on the interposer and coupling the second semiconductor die to the redistribution layer using a coupling mechanism. In some implementations, the pre-assembled interposer can include a conductive pillar.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method, comprising:
    forming a leadframe assembly, including:
        etching a leadframe to create a recessed leadframe portion and a leadframe portion, the recessed leadframe portion having a thickness less than a thickness of the leadframe portion; and
        coupling a first semiconductor die to the leadframe portion;
    forming, on an interposer made of an insulating material, an interposer assembly, the forming the interposer assembly including:
        forming a redistribution layer on a surface of the interposer;
        coupling a second semiconductor die coupled to the redistribution layer; and
        coupling a conductive pillar coupled to the redistribution layer;
    coupling the leadframe assembly to the interposer assembly, including:
        aligning the recessed leadframe portion on the leadframe assembly with the second semiconductor die on the interposer assembly; and
        coupling the conductive pillar with the leadframe portion, such that an end of the conductive pillar is coplanar with a surface of the first semiconductor die facing the recessed leadframe portion; and
    applying a molding between the recessed leadframe portion and the second semiconductor die after the leadframe assembly is coupled to the interposer assembly.

2. The method of claim 1, further comprising:
    singulating the interposer assembly before coupling the interposer assembly to the leadframe assembly.

3. The method of claim 1, further comprising:
    singulating the interposer assembly;
    coupling the singulated interposer assembly to the leadframe assembly; and
    singulating the leadframe assembly.

4. The method of claim 1, wherein:
    the forming the redistribution layer includes forming a plurality of traces on the interposer; and
    the coupling the second semiconductor die to the redistribution layer includes coupling the second semiconductor die with at least one trace of the plurality to traces.

5. The method of claim 1, wherein a thickness of the conductive pillar is a fraction of a millimeter.

6. The method of claim 1, wherein:
the forming the redistribution layer includes forming a plurality of traces on the interposer; and
the coupling the conductive pillar to the redistribution layer includes coupling the conductive pillar with at least one trace of the plurality of traces.

7. The method of claim 1, further comprising:
aligning the conductive pillar with an exposed solder portion coupled to the leadframe portion.

8. The method of claim 1, wherein a thickness of the conductive pillar is substantially equal to a thickness of the first semiconductor die.

9. The method of claim 1, wherein the first semiconductor die includes a high-side field effect transistor (FET), the second semiconductor die including an integrated circuit die, wherein the forming the leadframe assembly includes:
coupling a low-side FET to the leadframe portion.

10. The method of claim 1, wherein the leadframe assembly is coupled to the interposer assembly using a reflow process.

11. The method of claim 1,
wherein the molding is also applied the interposer, the first semiconductor die, and the second semiconductor die.

12. The method of claim 11, further comprising:
removing a portion of the molding such that at least a portion of the interposer is exposed through the molding.

13. A method for producing a quad flat no lead (QFN) device, the method comprising:
forming a leadframe having a leadframe portion and a recessed leadframe portion, the recessed leadframe portion having a thickness less than a thickness of the leadframe portion;
disposing a redistribution layer on a first surface of an interposer, the interposer including an insulating material, the interposer having a second surface opposite to the first surface, the redistribution layer including a conductive material and including a plurality of traces;
forming a layer of molding on the first surface of the interposer, the layer of molding having a thickness less than a thickness of the interposer;
coupling an integrated circuit (IC) to the redistribution layer, the IC being disposed between the redistribution layer and the recessed leadframe portion;
forming a molding portion disposed between the recessed leadframe portion and the IC;
coupling a low-side field effect transistor (FET) to the redistribution layer, the low-side FET being disposed between the redistribution layer and the leadframe portion, the low-side FET having a drain facing toward and electrically in contact with the leadframe portion;
coupling a high-side FET to the redistribution layer; and
coupling a first end of a conductive pillar to the redistribution layer and coupling a second end of the conductive pillar to the leadframe portion, the second end of the conductive pillar being coplanar with a surface of the IC that faces the recessed leadframe portion, the second end of the conductive pillar being coplanar with a surface of the low-side FET that faces the leadframe portion.

14. The method of claim 13, wherein a thickness of the conductive pillar is a fraction of a millimeter.

15. The method of claim 13, wherein a thickness of the conductive pillar is substantially equal to a thickness of the IC.

16. The method of claim 13, wherein a thickness of the conductive pillar is less than 85 microns.

\* \* \* \* \*